United States Patent
Tadokoro et al.

(10) Patent No.: US 11,809,091 B2
(45) Date of Patent: Nov. 7, 2023

(54) SUBSTRATE PROCESSING APPARATUS AND PROCESSING CONDITION ADJUSTMENT METHOD

(71) Applicant: Tokyo Electron Limited, Tokyo (JP)

(72) Inventors: Masahide Tadokoro, Koshi (JP);
Masashi Enomoto, Koshi (JP);
Kentaro Yamamura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 38 days.

(21) Appl. No.: 17/625,370

(22) PCT Filed: Jul. 10, 2020

(86) PCT No.: PCT/JP2020/027054
§ 371 (c)(1),
(2) Date: Jan. 7, 2022

(87) PCT Pub. No.: WO2021/015010
PCT Pub. Date: Jan. 28, 2021

(65) Prior Publication Data
US 2022/0252992 A1    Aug. 11, 2022

(30) Foreign Application Priority Data

Jul. 19, 2019 (JP) ................................. 2019-133652

(51) Int. Cl.
*G03F 7/00* (2006.01)
*G03F 7/20* (2006.01)

(52) U.S. Cl.
CPC ................................ *G03F 7/70875* (2013.01)

(58) Field of Classification Search
CPC ........ G03F 7/70875; G03F 7/168; G03F 7/16; G03F 7/30; G03F 7/38
See application file for complete search history.

(56) References Cited

U.S. PATENT DOCUMENTS

| 8,253,077 B2 * | 8/2012 | Ogata | ............... H01L 21/67248 430/30 |
| 8,927,906 B2 * | 1/2015 | Tadokoro | .................. G03F 7/38 219/220 |
| 2020/0393803 A1 * | 12/2020 | Mori | ........................ B05D 1/40 |

FOREIGN PATENT DOCUMENTS

JP            2017-028086 A      2/2017

OTHER PUBLICATIONS

International Search Report dated Sep. 24, 2020 issued in corresponding international patent application No. PCT/JP2020/027054 (and English translation).

* cited by examiner

*Primary Examiner* — Hung V Nguyen
(74) *Attorney, Agent, or Firm* — POSZ LAW GROUP, PLC

(57) ABSTRACT

A substrate processing apparatus which processes includes a thermal processor that performs thermal processing on the substrate; an imager that images the substrate; and a controller that executes adjustment processing of adjusting conditions of processing on the substrate. The adjustment processing includes: controlling the imager to image an unexposed adjustment substrate on which a resist film is formed; controlling the thermal processor to perform the thermal processing on the adjustment substrate subjected to uniform exposure processing of exposing each region of a substrate surface with a fixed exposure amount after the pre-exposure imaging; controlling the imager to image the adjustment substrate after the thermal processing; estimating an in-plane temperature distribution of the adjustment substrate in the thermal processing based on the pre-exposure imaging result and the post-heating imaging result; and deciding processing conditions of the thermal processing based on an estimation result of the in-plane temperature distribution.

15 Claims, 16 Drawing Sheets

US 11,809,091 B2

SUBSTRATE PROCESSING APPARATUS AND PROCESSING CONDITION ADJUSTMENT METHOD

This application is a U.S. national stage application of International Application No. PCT/JP2020/027054 filed on Jul. 10, 2020, based upon and claims the benefit of priority of the prior Japanese Patent Application No. 2019-133652 filed on Jul. 19, 2019, the entire contents of which are incorporated herein by reference.

TECHNICAL FIELD

This disclosure relates to a substrate processing apparatus and a processing condition adjustment method.

BACKGROUND ART

Patent Document 1 discloses a substrate processing method of uniformly forming a resist pattern with a desired line width on a wafer. This substrate processing method acquired a film thickness distribution of a resist film formed on the wafer before exposure in an exposure apparatus. Then, pattern exposure is performed on the wafer on which the resist film is formed. Next, heat processing is performed on the resist film after the pattern exposure. Then, a film thickness distribution of the resist film after the heat processing is acquired, and film thickness difference data is calculated from the film thickness distribution before the exposure and the film thickness distribution after the heat processing. Subsequently, referring to a line width correlation data table, the line width (estimated line width) corresponding to the film thickness difference data is calculated within the wafer. If the calculated estimated line width varies within the wafer, the heat processing is performed again on the resist film. The conditions of the heat processing are set to make the heat temperature in a region where the estimated line width is large higher than the heating temperature in the other region. Then, developing processing of the resist film subjected to the heat processing again is performed.

PRIOR ART DOCUMENT

Patent Document

Patent Document 1: Japanese Laid-open Patent Publication No. 2017-28086

DISCLOSURE OF THE INVENTION

Problems to be Solved by the Invention

A technique according to this disclosure performs at least heat processing after exposure of the processing performed on a substrate for forming a resist pattern such that its processing result becomes uniform within the substrate and forms a resist pattern having a uniform line width within a plane on the substrate.

Means for Solving the Problems

An aspect of this disclosure is a substrate processing apparatus which processes a substrate, including: a thermal processor configured to perform thermal processing on the substrate; an imager configured to image the substrate; and a controller, wherein: the controller is configured to execute adjustment processing of adjusting conditions of processing on the substrate; and the adjustment processing includes: a pre-exposure imaging step of controlling the imager to image an unexposed adjustment substrate on which a resist film is formed; a thermal processing step of controlling the thermal processor to perform the thermal processing on the adjustment substrate subjected to uniform exposure processing of exposing each region of a substrate surface with a fixed exposure amount after the pre-exposure imaging step; a post-heating imaging step of controlling the imager to image the adjustment substrate after the thermal processing step; a temperature distribution estimation step of estimating an in-plane temperature distribution of the adjustment substrate in the thermal processing based on an imaging result at the pre-exposure imaging step and on an imaging result at the post-heating imaging step; and a thermal processing condition decision step of deciding processing conditions of the thermal processing based on an estimation result of the in-plane temperature distribution of the adjustment substrate.

Effect of the Invention

According to this disclosure, it is possible to perform at least heat processing after exposure of the processing performed on a substrate for forming a resist pattern such that its processing result becomes uniform within the substrate and form a resist pattern having a uniform line width within a plane on the substrate.

EMBODIMENTS FOR CARRYING OUT THE INVENTION

Figure 1:
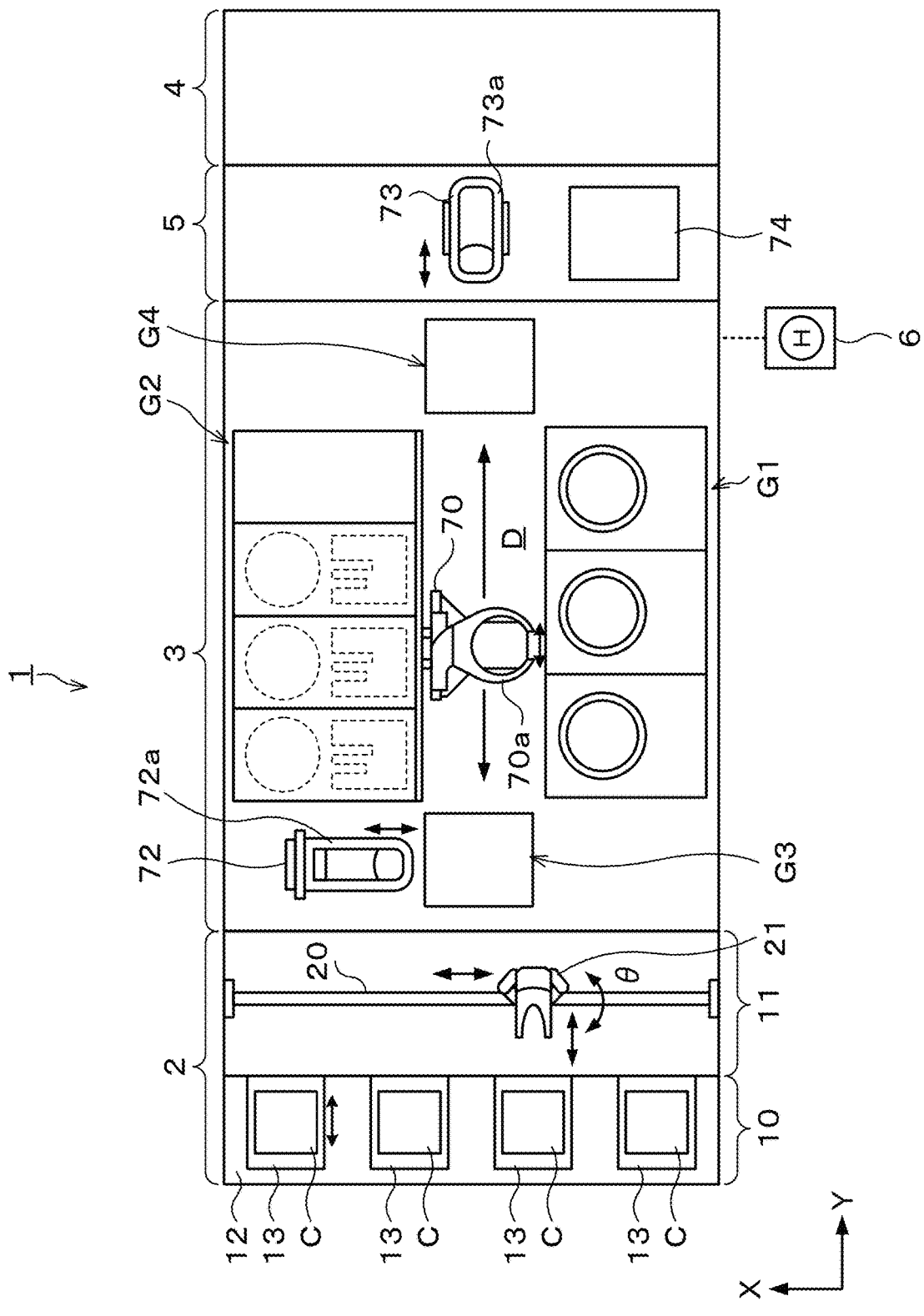
FIG. 1 is a plan view illustrating the outline of a configuration of a substrate processing system according to a first embodiment.

In a photolithography step in a manufacturing process of a semiconductor device or the like, a series of processing is performed in order to form a predetermined resist pattern on a semiconductor wafer (hereinafter, referred to as a "wafer"). The series of processing includes, for example, resist coating processing of supplying a resist solution onto the wafer to form a resist film, and exposure processing of exposing the resist film into a predetermined pattern. The series of processing also includes heat processing (PEB (Post Exposure Bake) processing) of accelerating the chemical reaction in the resist film after the exposure, developing processing of developing the exposed resist film and so on.

The temperature of the wafer in the PEB processing significantly affects the line width of the resist pattern finally formed on the wafer. Further, the resist pattern is required to have the line width uniformly formed within the plane. Hence, the thermal processing unit which performs the PEB processing is provided with a plurality of heating regions, and the heating regions can be set to different temperatures.

In the setting of the temperature of each heating region, conventionally, a series of resist pattern forming processing is actually performed on a test wafer, the line width of the resist pattern is measured for each region, and the temperature of each heating region is set based on a result of the measurement. However, in this method, the uniformity within the wafer of the line width of the resist pattern is improved, but a processing result of the heat processing of the wafer, namely, the temperature of the wafer cannot be made uniform within the wafer. This is because the line with of the resist pattern is affected also by processing conditions of pattern exposure, processing conditions of development and so on. This is the same also in the case of using the estimated line width of the resist pattern as in Patent Document 1 not using the line width of the resist pattern actually formed and measured for the setting of the temperature of each heating region of the thermal processing apparatus.

To further improve the uniformity within the plane of the line width of the resist pattern, it is essential to perform each processing for forming the resist pattern including the heat processing of the wafer so that the processing result becomes uniform within a substrate.

Hence, the technique according to this disclosure performs at least heat processing after exposure of the processing performed on a substrate for forming a resist pattern so that its processing result becomes uniform within the substrate, thereby enabling the formation of the resist pattern having a line width uniform within the plane.

Hereinafter, a substrate processing apparatus and a processing condition adjustment method according to embodiments will be explained referring to the drawings. Note that the same codes are given to components having substantially the same functional configurations in the description and the drawings to omit duplicated explanation.

First Embodiment

Figure 2:
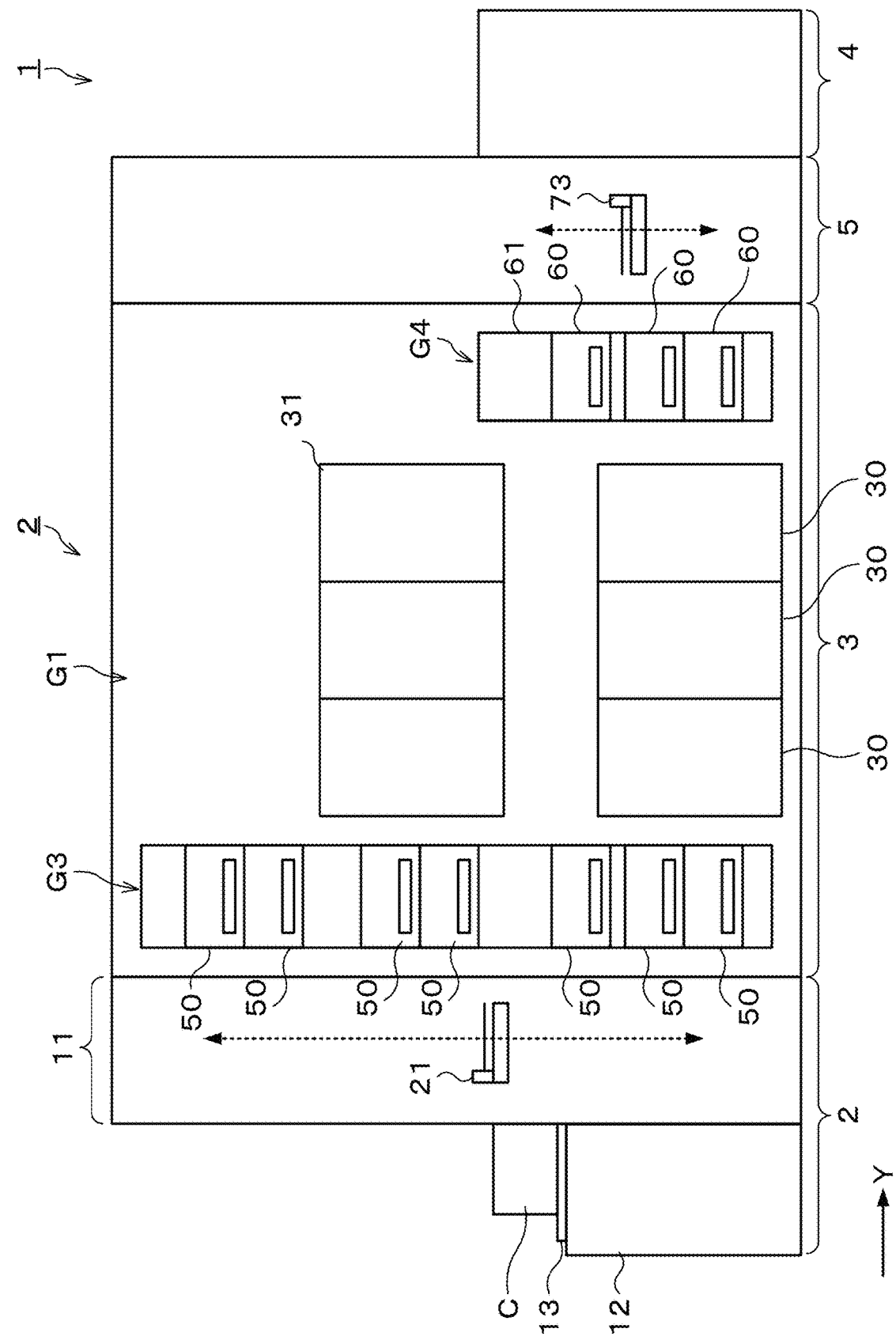
FIG. 2 is a front view illustrating the outline of the configuration of the substrate processing system according to the first embodiment.
Figure 3:
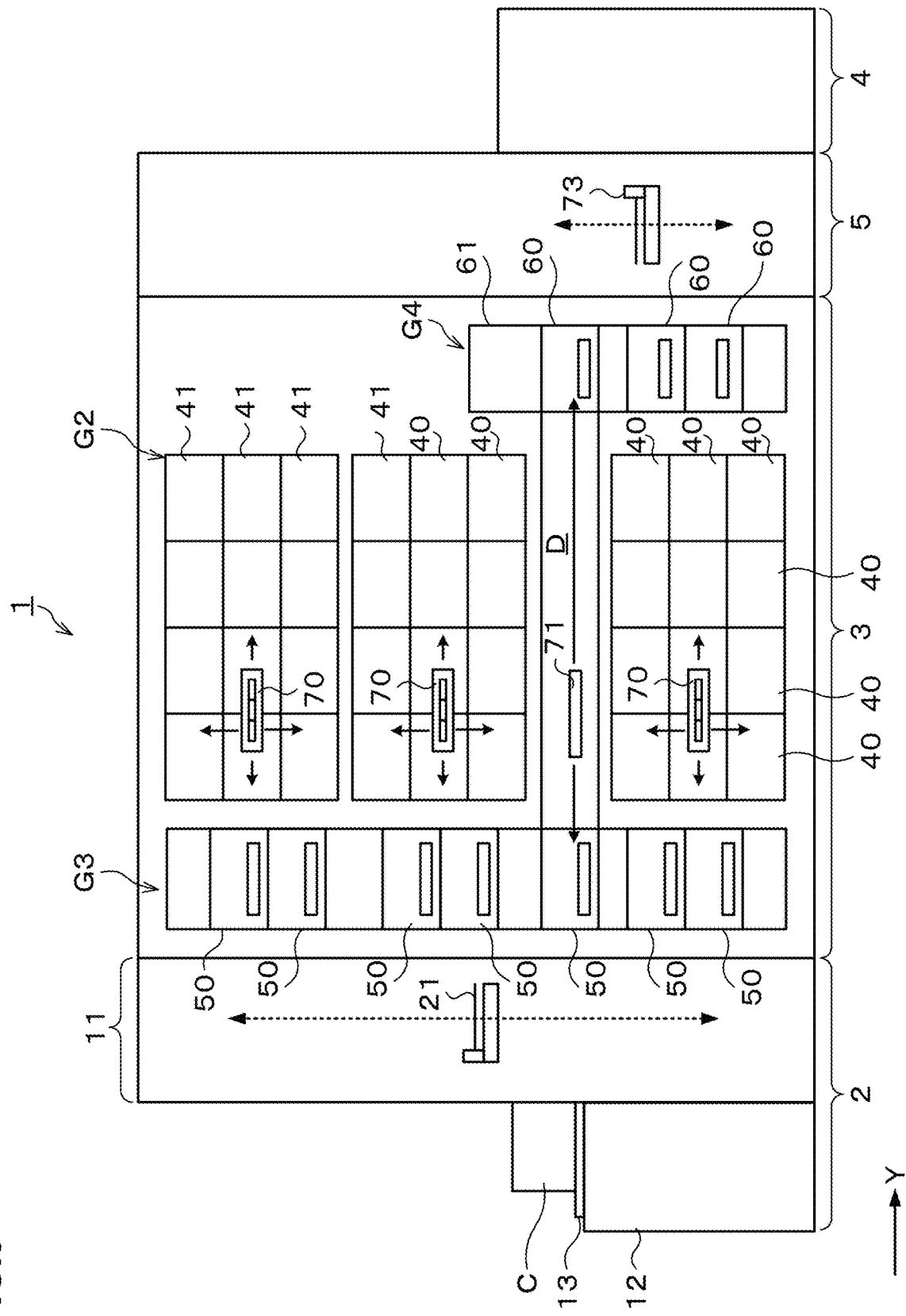
FIG. 3 is a rear view illustrating the outline of the configuration of the substrate processing system according to the first embodiment.

FIG. 1 is an explanatory view illustrating the outline of an internal configuration of a substrate processing apparatus 1 according to a first embodiment. FIG. 2 and FIG. 3 are a front view and a rear view illustrating the outline of the internal configuration of the substrate processing apparatus 1, respectively.

The substrate processing apparatus 1 has, for example, a cassette station 2 into/out of which a cassette C is transferred from/to the outside, and a processing station 3 including a plurality of various processing units which perform predetermined processing such as resist coating processing, PEB processing and so on as illustrated in FIG. 1. The substrate processing apparatus 1 further has a configuration in which the cassette station 2, the processing station 3, and an interface station 5 which performs delivery of the wafer W to/from an exposure apparatus 4 adjacent to the processing station 3 are integrally connected. The substrate processing apparatus 1 further has a controller 6 which controls the substrate processing apparatus 1.

The cassette station 2 is divided, for example, into a cassette transfer-in/out section 10 and a wafer transfer section 11. The cassette transfer-in/out section 10 is provided, for example, at an end on a Y-direction negative direction (left direction in FIG. 1) side in the substrate processing apparatus 1. In the cassette transfer-in/out section 10, a cassette stage 12 is provided. On the cassette stage 12, a plurality of, for example, four stage plates 13 are provided. The stage plates 13 are provided arrange side by side in a line in an X-direction (up-down direction in FIG. 1) being a horizontal direction. On the stage plates 13, cassettes C can be mounted when the cassettes C are transferred in/out from/to the outside of the substrate processing apparatus 1.

In the wafer transfer section 11, a wafer transfer unit 21 is provided which is movable on a transfer path 20 extending in the X-direction as illustrated in FIG. 1. The wafer transfer unit 21 is movable also in a up-down direction and around a vertical axis (in a θ-direction), and can transfer the wafer W between the cassette C on each stage plate 13 and a later-explained delivery unit in a third block G3 in the processing station 3.

In the processing station 3, a plurality of, for example, four such as first to fourth blocks G1, G2, G3, G4 each including various units are provided. For example, the first block G1 is provided on the front side (X-direction negative direction side in FIG. 1) in the processing station 3, and the second block G2 is provided on the rear side (X-direction positive direction side in FIG. 1) in the processing station 3. Further, the third block G3 is provided on the cassette station 2 side (Y-direction negative direction side in FIG. 1) in the processing station 3, and the fourth block G4 is provided on the interface station 5 side (Y-direction positive direction side in FIG. 1) in the processing station 3.

In the first block G1, a plurality of solution processing units, for example, developing processing units 30 as developing processors each of which performs developing processing on the wafer W, and resist coating units 31 each of which coats the wafer \V with the resist solution to form a resist film are arranged in this order from the bottom as illustrated in FIG. 2.

For example, three developing processing units 30 and three resist coating units 31 are arranged side by side in the horizontal direction. The numbers and the arrangement of the developing processing units 30 and the resist coating units 31 can be arbitrarily selected.

In each of the developing processing units 30 and the resist coating units 31, for example, spin coating of coating the top of the wafer W with a predetermined processing solution is performed. In the spin coating, the processing solution is discharged onto the wafer W, for example, from a coating nozzle and the wafer W is rotated to diffuse the processing solution over the surface of the wafer W. Note that the configuration of the developing processing unit 30 will be explained later.

For example, in the second block G2, thermal processing units 40 as thermal processors each of which performs thermal processing such as heating and cooling on the wafer W, and edge exposure units 41 each of which exposes the outer peripheral portion of the wafer W are provided one above the other in the up-down direction and side by side in the horizontal direction as illustrated in FIG. 3. The numbers and the arrangement of the thermal processing units 40 and edge exposure units 41 can also be arbitrarily selected. Note that the configuration of the thermal processing unit 40 will be explained later.

In the third block G3, a plurality of delivery units 50 are provided. Further, in the fourth block G4, a plurality of delivery units 60 are provided, and a defect inspection unit 61 is provided thereon. Note that the configuration of the defect inspection unit 61 will be explained later.

As illustrated in FIG. 1, in a region surrounded by the first block G1 to the fourth block G4, a wafer transfer region D is formed. In the wafer transfer region D, for example, a wafer transfer unit 70 is arranged.

The wafer transfer unit 70 has a transfer arm 70a movable, for example, in the Y-direction, the front-rear direction, the θ-direction, and the up-down direction. The wafer transfer unit 70 can move in the wafer transfer region D and transfer the wafer W to a predetermined unit in the first block G1, the second block G2, the third block G3, and the fourth block G4 therearound. A plurality of the wafer transfer units 70 are arranged one above the other, for example, as illustrated in FIG. 3, and can transfer the wafers W, for example, to predetermined units at approximately the same height in the blocks G1 to G4.

Further, in the wafer transfer region D, a shuttle transfer unit 71 is provided which linearly transfers the wafer W between the third block G3 and the fourth block G4.

The shuttle transfer unit 71 is configured to be linearly movable, for example, in the Y-direction in FIG. 3. The shuttle transfer unit 71 can move in the Y-direction while supporting the wafer W, and transfer the wafer W between the delivery unit 50 in the third block G3 and the delivery unit 60 in the fourth block G4 at approximately the same height.

As illustrated in FIG. 1, a wafer transfer unit 72 is provided on the X-direction positive direction side in the third block G3. The wafer transfer unit 72 has a transfer arm 72a that is movable, for example, in the front-rear direction, the θ-direction, and the up-down direction. The wafer transfer unit 72 can move up and down while supporting the wafer W to transfer the wafer W to each of the delivery units 50 in the third block G3.

In the interface station 5, a wafer transfer unit 73 and a delivery unit 74 are provided. The wafer transfer unit 73 has a transfer arm 73a that is movable, for example, in the Y-direction, the θ-direction, and the up-down direction. The wafer transfer unit 73 can transfer the wafer W to/from each of the delivery units 60 in the fourth block G4, the delivery unit 74, and the exposure apparatus 4, for example, while supporting the wafer W by the transfer arm 73a.

The above controller 6 is, for example, a computer including a program storage (not illustrated). The program storage stores programs for controlling the processing on the wafer W including processing condition adjustment processing in the substrate processing apparatus 1 by controlling the operations of the drive systems of the above various processing units and transfer units. Note that the above programs may be the ones recorded in a computer-readable storage medium H and installed from the storage medium H into the controller 6.

Figure 4:
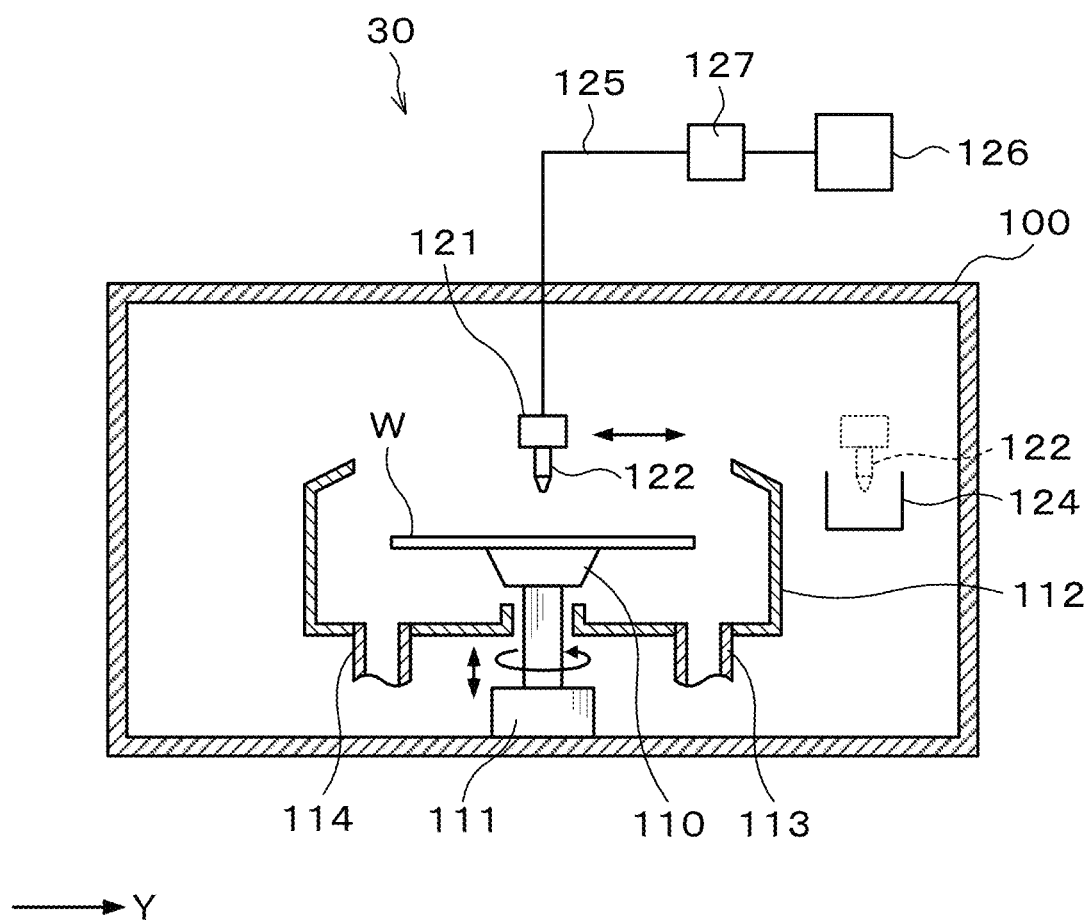
FIG. 4 is a longitudinal sectional view illustrating the outline of a configuration of a developing processing unit.
Figure 5:
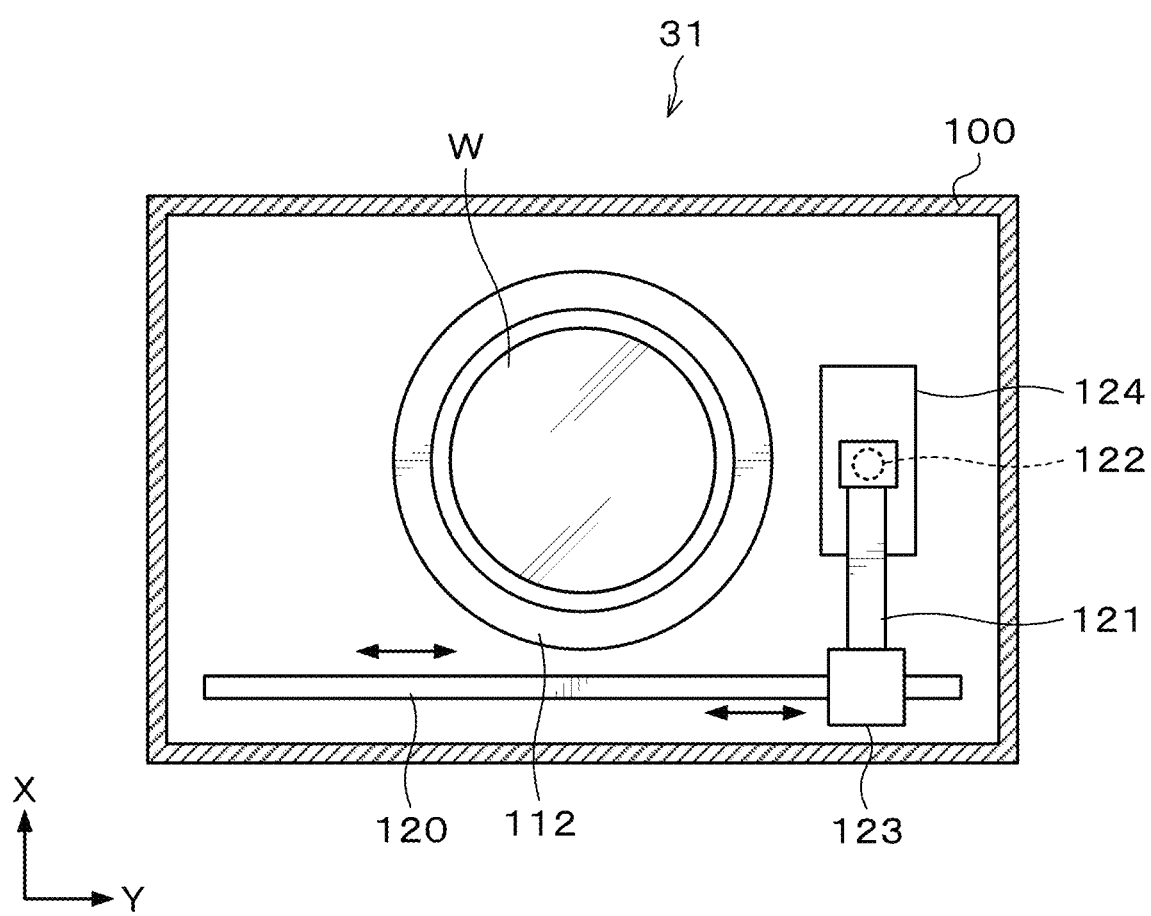
FIG. 5 is a transverse sectional view illustrating the outline of the configuration of the developing processing unit.

Next, the configuration of the above developing processing unit 30 will be explained. FIG. 4 and FIG. 5 are a longitudinal sectional view and a transverse sectional view illustrating the outline of a configuration of the developing processing unit 30, respectively.

The developing processing unit 30 has a processing container 100 whose inside can be hermetically closed as illustrated in FIG. 4 and FIG. 5. A side surface on the wafer transfer unit 70 side of the processing container 100 is formed with a transfer-in/out port (not illustrated) for the wafer W, and is provided with an opening and closing shutter (not illustrated) at the transfer-in/out port.

At the central portion in the processing container 100, a spin chuck 110 is provided which holds and rotates the wafer W. The spin chuck 110 has a horizontal upper surface, and the upper surface is provided, for example, with a suction port (not illustrated) for sucking the wafer W. By the suction from the suction port, the wafer W can be sucked and held on the spin chuck 110.

Below the spin chuck 110, a chuck drive 111 including, for example, a motor is provided. The spin chuck 110 can rotate at a predetermined speed by the chuck drive 111. The chuck drive 111 is further provided with, for example, a raising and lowering drive source such as a cylinder so that the spin chuck 110 can rise and lower.

Around the spin chuck 110, a cup 112 is provided which receives liquid scattering or dropped off from the wafer W and collects the liquid. To a lower surface of the cup 112, a drain pipe 113 which drains the collected liquid and an exhaust pipe 114 which vacuums and exhausts the atmosphere in the cup 112 are connected.

As illustrated in FIG. 5, on an X-direction negative direction (lower direction in FIG. 5) side of the cup 112, a rail 120 is formed which extends along a Y-direction (right-left direction in FIG. 5). The rail 120 is formed, for example, from a Y-direction negative direction (left direction in FIG. 5) side outer position to a Y-direction positive direction (right direction in FIG. 5) side outer position of the cup 112. On the rail 120, an arm 121 is attached.

On the arm 121, a coating nozzle 122 is supported which supplies the developing solution onto the wafer W as illustrated in FIG. 4 and FIG. 5. The arm 121 is movable on the rail 120 by a nozzle drive 123 illustrated in FIG. 5. This allows the coating nozzle 122 to move from a waiting section 124 provided at a Y-direction positive direction side outer position of the cup 112 to above a central portion of the wafer W in the cup 112, and further move above the wafer W in a radial direction of the wafer W. Further, the arm 121 can freely rise and lower by the nozzle drive 123 and can adjust the height of the coating nozzle 122.

To the coating nozzle 122, a supply pipe 125 which supplies the developing solution to the coating nozzle 122 is connected as illustrated in FIG. 4. The supply pipe 125 communicates with a developing solution supply source 126 storing the developing solution therein. Further, the supply pipe 125 is provided with a supply equipment group 127 including a valve and a flow regulator, and so on for controlling the flow of the developing solution.

Note that the configuration of the resist coating unit 31 is the same as the configuration of the above developing processing unit 30. However, the processing solution to be supplied from the coating nozzle is different between the developing processing unit 30 and the resist coating unit 31.

Figure 6:
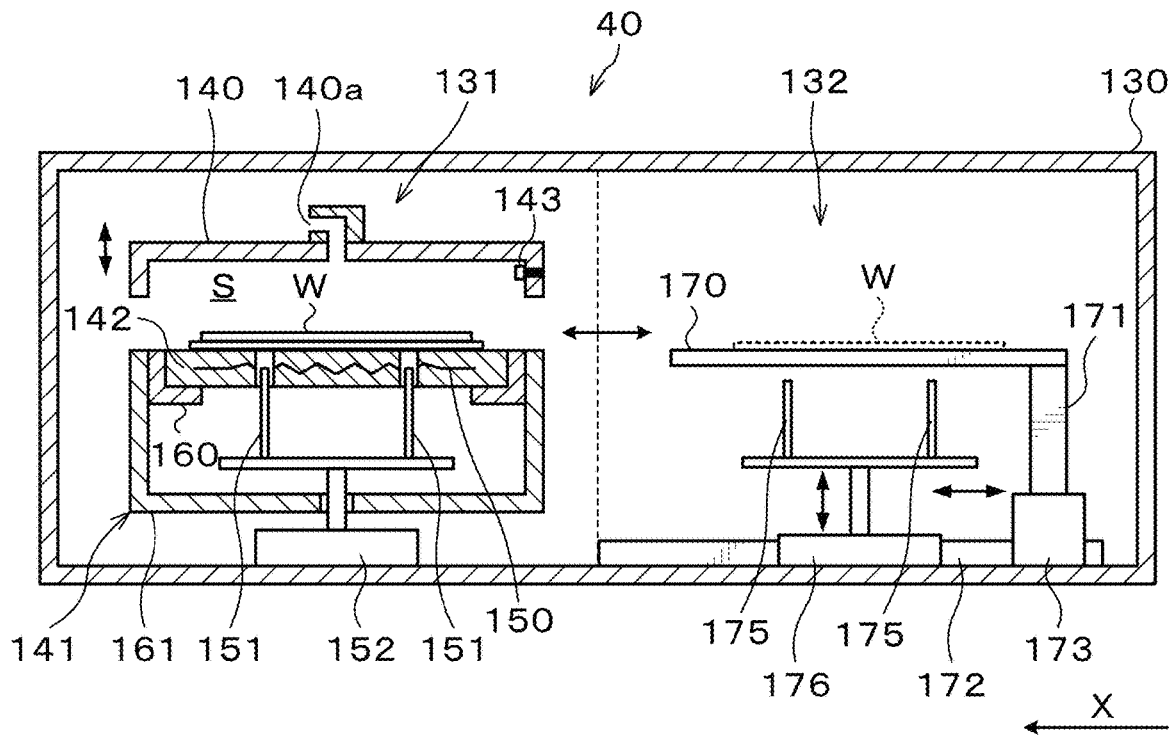
FIG. 6 is a longitudinal sectional view illustrating the outline of a configuration of a thermal processing unit.
Figure 7:
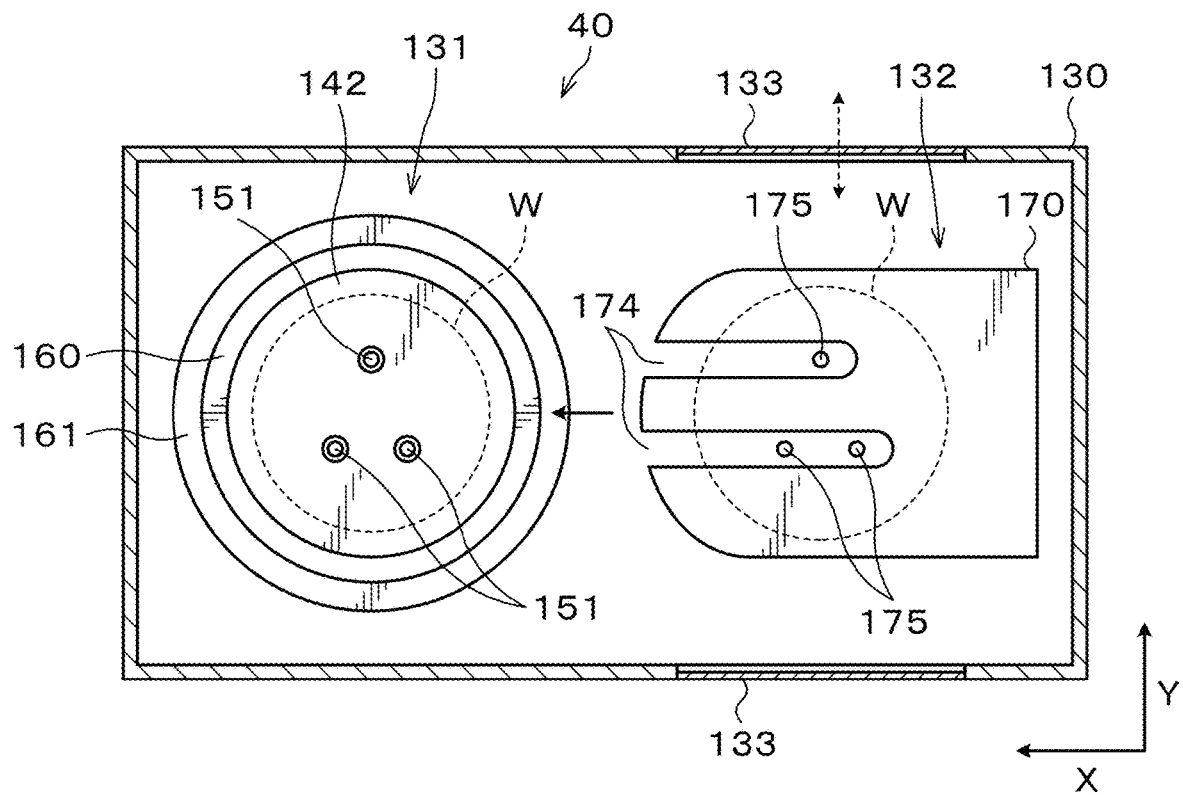
FIG. 7 is a transverse sectional view illustrating the outline of the configuration of the thermal processing unit.

Subsequently, the configuration of the thermal processing unit 40 will be explained. FIG. 6 and FIG. 7 are a longitudinal sectional view and a transverse sectional view illustrating the outline of the configuration of the thermal processing unit 40, respectively.

For example, the thermal processing unit 40 includes a heating part 131 which performs heat processing on the wafer W and a cooling part 132 which performs cooling processing on the wafer W in a casing 130 as illustrated in FIG. 6 and FIG. 7. Both sides surfaces near the cooling part 132 of the casing 130 are formed with transfer-in/out ports 133 for transferring in/out the wafer W as illustrated in FIG. 7.

The heating part 131 includes a lid 140 which is located on the upper side and movable up and down and a hot plate housing 141 which is located on the lower side and unites with the lid 140 to form a processing chamber S as illustrated in FIG. 6.

The lid 140 has an almost cylindrical shape with a lower surface open, and covers an upper surface being a surface to be processed of the wafer W mounted on a later-explained hot plate 142. At the center of an upper surface of the lid 140, an exhauster 140a is provided. The atmosphere inside the processing chamber S is exhausted from the exhauster 140a.

Further, the lid 140 is provided with a temperature sensor 143 being a temperature measurer which measures the temperature of the lid 140. The temperature sensor 143 is provided at an end of the lid 140 in the example of the drawing, but may be provided at a center or the like of the lid 140.

At the middle of the hot plate housing 141, the hot plate 142 is provided on which the wafer W is mounted and which heats the mounted wafer W. The hot plate 142 has an almost disk shape with a large thickness, and a heater 150 which heats the upper surface of the hot plate 142, namely, a mounting surface for the wafer W is provided therein. As the heater 150, for example, an electric heater is used. The configuration of the hot plate 142 will be explained later.

In the hot plate housing 141, raising and lowering pins 151 are provided which penetrate the hot plate 142 in the thickness direction. The raising and lowering pins 151 freely rise and lower by a raising and lowering drive 152 such as a cylinder and can project from the upper surface of the hot plate 142 to deliver the wafer W to/from a later-explained cooling plate 170.

The hot plate housing 141 has, for example, an annular holding member 160 which houses the hot plate 142 and holds the outer peripheral portion of the hot plate 142, and an almost cylindrical support ring 161 which surrounds the outer periphery of the holding member 160 as illustrated in FIG. 6.

In the cooling part 132 adjacent to the heating part 131, for example, the cooling plate 170 which mounts and cools the wafer W thereon is provided. The cooling plate 170 has an almost square flat plate shape, and has an end face on the heating part 131 side curved in an arc shape as illustrated in FIG. 7. The cooling plate 170 has a not-illustrated embedded cooling member such as a Peltier element or the like therein and can regulate the cooling plate 170 to a predetermined set temperature.

The cooling plate 170 is supported, for example, by a supporting arm 171, and the supporting arm 171 is attached to a rail 172 extending in the X-direction toward the heating part 131 side as illustrated in FIG. 6. The cooling plate 170 can move on the rail 172 by a drive mechanism 173 attached to the supporting arm 171. Thus, the cooling plate 170 can move to above the hot plate 142 on the heating part 131 side.

The cooling plate 170 is formed with, for example, two slits 174 along the X-direction in FIG. 7. The slits 174 are formed from the end face on the heating part 131 side of the cooling plate 170 to the vicinity of the middle of the cooling plate 170. The slits 174 can prevent interference between the cooling plate 170 moved to the heating part 131 side and the raising and lowering pins 151 above the hot plate 142. As illustrated in FIG. 6, below the cooling plate 170 located in the cooling part 132, raising and lowering pins 175 are provided. The raising and lowering pins 175 can rise and lower by a raising and lowering drive 176. The raising and lowering pins 175 can rise from below the cooling plate 170, pass through the slits 174, project to above the cooling plate 170, and deliver the wafer W, for example, to/from the wafer transfer unit 70 entering the inside of the housing 130 from the transfer-in/out port 133.

Figure 8:
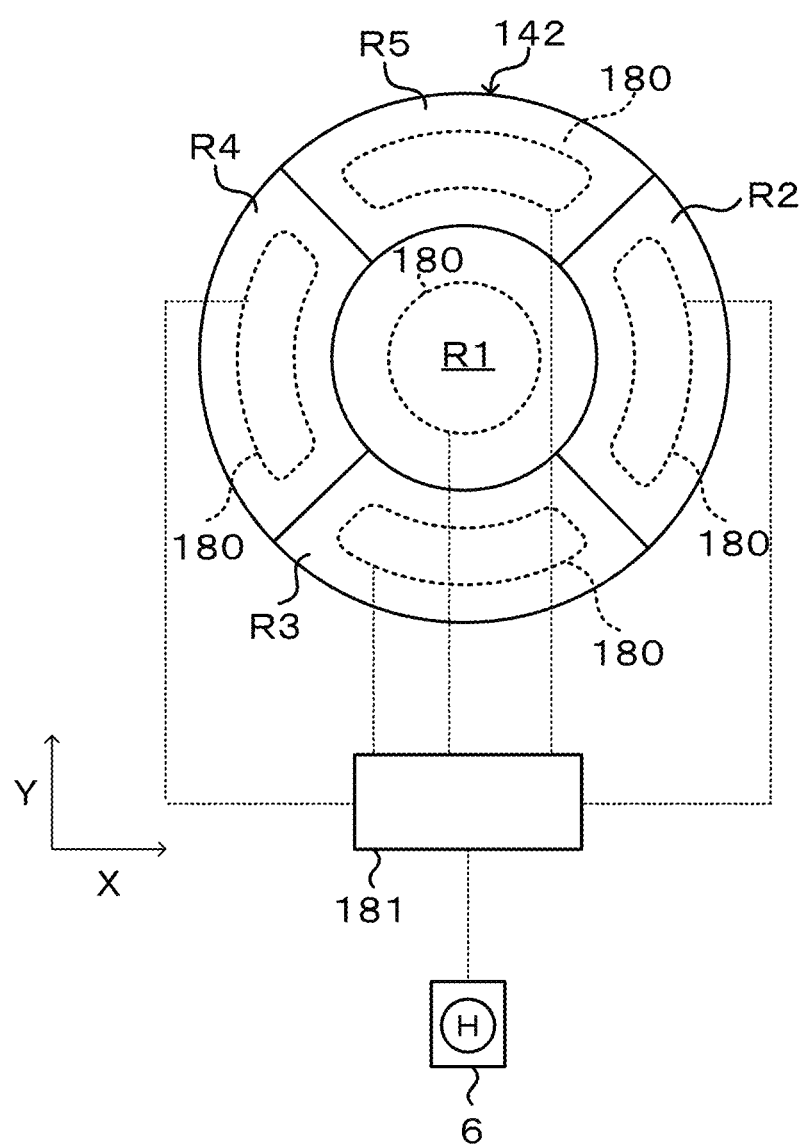
FIG. 8 is a plan view illustrating the outline of a configuration of a hot plate of the thermal processing unit.

Next, the configuration of the hot plate 142 will be explained in detail. FIG. 8 is a plan view illustrating the outline of a configuration of the hot plate 142. The hot plate 142 is sectioned into a plurality of, for example, five hot plate regions (hereinafter, referred to as "channels") R1 to R5 as illustrated in FIG. 8. The hot plate 142 is sectioned into the channel R1 in a circular shape located, for example, at the center in plan view, and the channels R2 to R5 obtained by equally dividing a surrounding area of the channel R1 into four parts in arc shapes.

In each of the channels R1 to R5 of the hot plate 142, a heater 180 is individually embedded and can individually heat each of the channels R1 to R5. The heating value of the heater 180 in each of the channels R1 to R5 is regulated, for example, by a temperature controller 181. The temperature controller 181 can regulate the heating value of each of the heaters 180 to control the temperature of each of the channels R1 to R5 to a predetermined set temperature. The temperature setting in the temperature controller 181 is performed by the controller 6.

Figure 9:
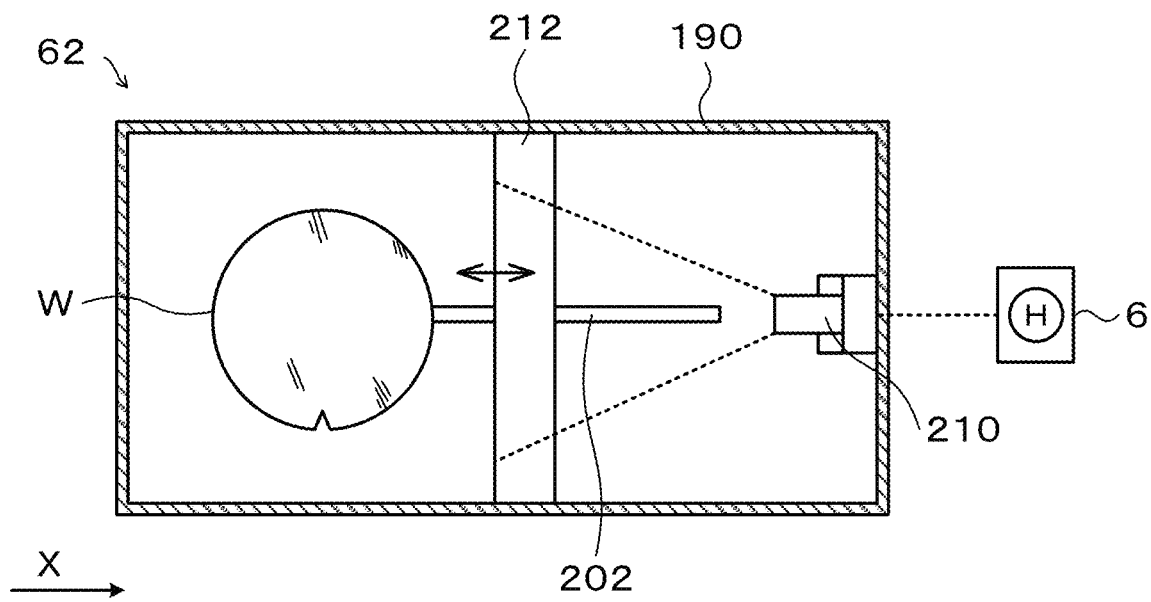
FIG. 9 is a longitudinal sectional view illustrating the outline of a configuration of a defect inspection unit.
Figure 10:
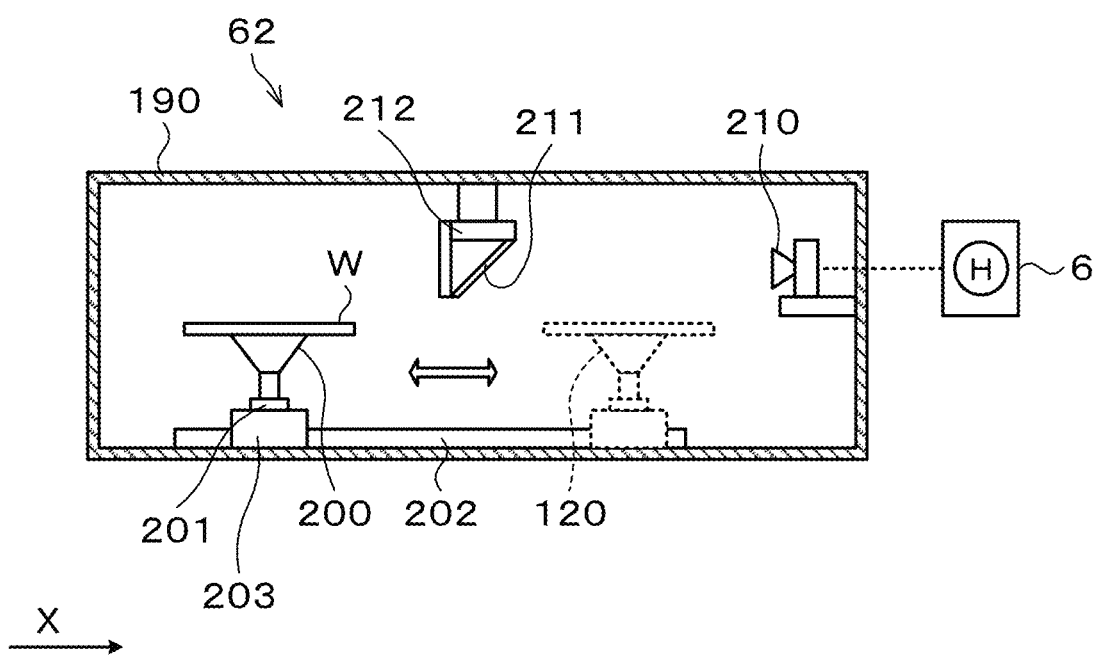
FIG. 10 is a transverse sectional view illustrating the outline of the configuration of the defect inspection unit.

Next, the configuration of the defect inspection unit 61 will be explained. FIG. 9 and FIG. 10 are a longitudinal sectional view and a transverse sectional view illustrating the outline of the configuration of the defect inspection unit 61, respectively. The defect inspection unit 61 has a casing 190 as illustrated in FIG. 9 and FIG. 10. In the casing 190, a stage 200 on which the wafer W is mounted is provided. The stage 200 freely rotates and stops by a rotation drive 201 such as a motor. At a bottom of the casing 190, a guide rail 202 is provided which extends from one end side (an X-direction negative direction side in FIG. 10) to another end side (an X-direction positive direction side in FIG. 10) in the casing 190. The stage 200 and the rotation drive 201 are provided on the guide rail 202 and can move along the guide rail 202 by a drive 203.

On a side surface on the other end side (the X-direction positive direction side in FIG. 10) in the casing 190, an imager 210 is provided. For the imager 210, for example, a wide-angle CCD camera is used.

Near the middle of the top of the casing 190, a half mirror 211 is provided. The half mirror 211 is provided at a position facing the imager 210 in such a state that its mirror surface is inclined upward at 45 degrees toward the imager 210 from a state of being directed vertically downward. Above the half mirror 211, an illuminator 212 is provided. The half mirror 211 and the illuminator 212 are fixed to the upper surface in the casing 190. The illumination from the illuminator 212 passes through the half mirror 211 and is applied downward. Accordingly, light reflected from an object existing below the illuminator 212 is further reflected from the half mirror 211 and captured into the imager 210. In other words, the imager 210 can image the object existing within an irradiation region by the illuminator 212.

Next, the wafer processing using the substrate processing apparatus 1 will be explained.

In the wafer processing using the substrate processing apparatus 1, first, the wafer W is taken out of the cassette C on the cassette stage 12 by the wafer transfer unit 21 and transferred to the delivery unit 50 in the processing station 3.

Then, the wafer W is transferred by the wafer transfer unit 70 to the thermal processing unit 40 in the second block G2 and subjected to temperature regulation processing. Thereafter, the wafer W is transferred to the resist coating processing unit 31 in the first block G1, in which a resist film is formed on the wafer W. The wafer W is then transferred to the thermal processing unit 40 and subjected to pre-bake processing (PAB: Pre-Applied Bake). Note that the similar thermal processing is performed in the pre-bake processing, and PEB processing and post-bake processing at subsequent stages. However, the thermal processing units 40 used for the thermal processing are different from one another.

The wafer W is then transferred to the edge exposure unit 41 and subjected to edge exposure processing.

The wafer W is then transferred to the exposure apparatus 4 and subjected to exposure processing in a predetermined pattern.

The wafer W is then transferred to the thermal processing unit 40 and subjected to the PEB processing. The wafer W is then transferred, for example, to the developing processing unit 30 and subjected to developing processing. After the finish of the developing processing, the wafer W is transferred to the thermal processing unit 40 and subjected to the post-bake processing. The wafer W is then transferred to the defect inspection unit 61, in which the defect inspection is performed on the wafer W. In the defect inspection, an inspection whether there is a flaw or adhesion of a foreign substance is performed. Then, the wafer W is transferred to the cassette C on the cassette stage 12, with which a series of photolithography steps is completed.

Figure 11:
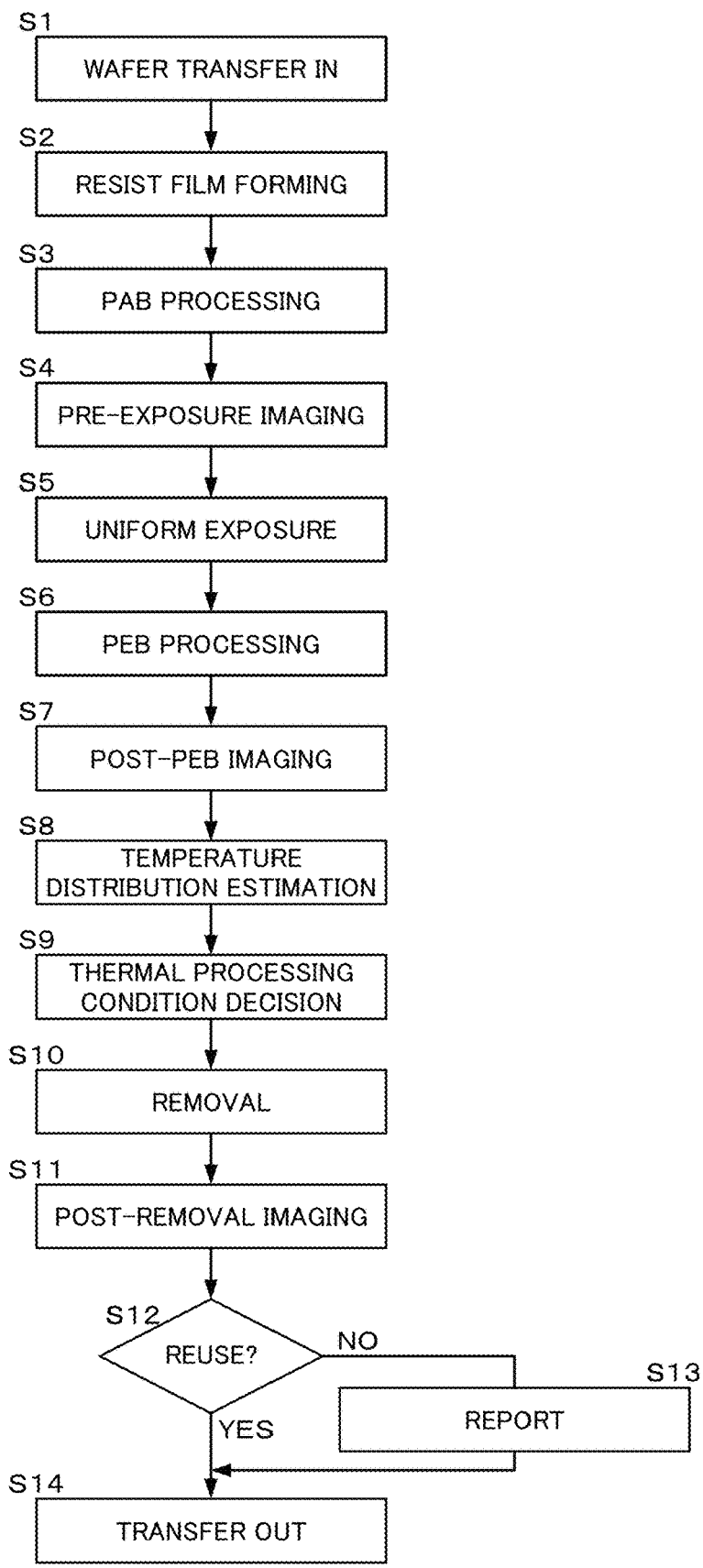
FIG. 11 is a flowchart for explaining adjustment processing of processing conditions of a PEB processing.
Figure 12:
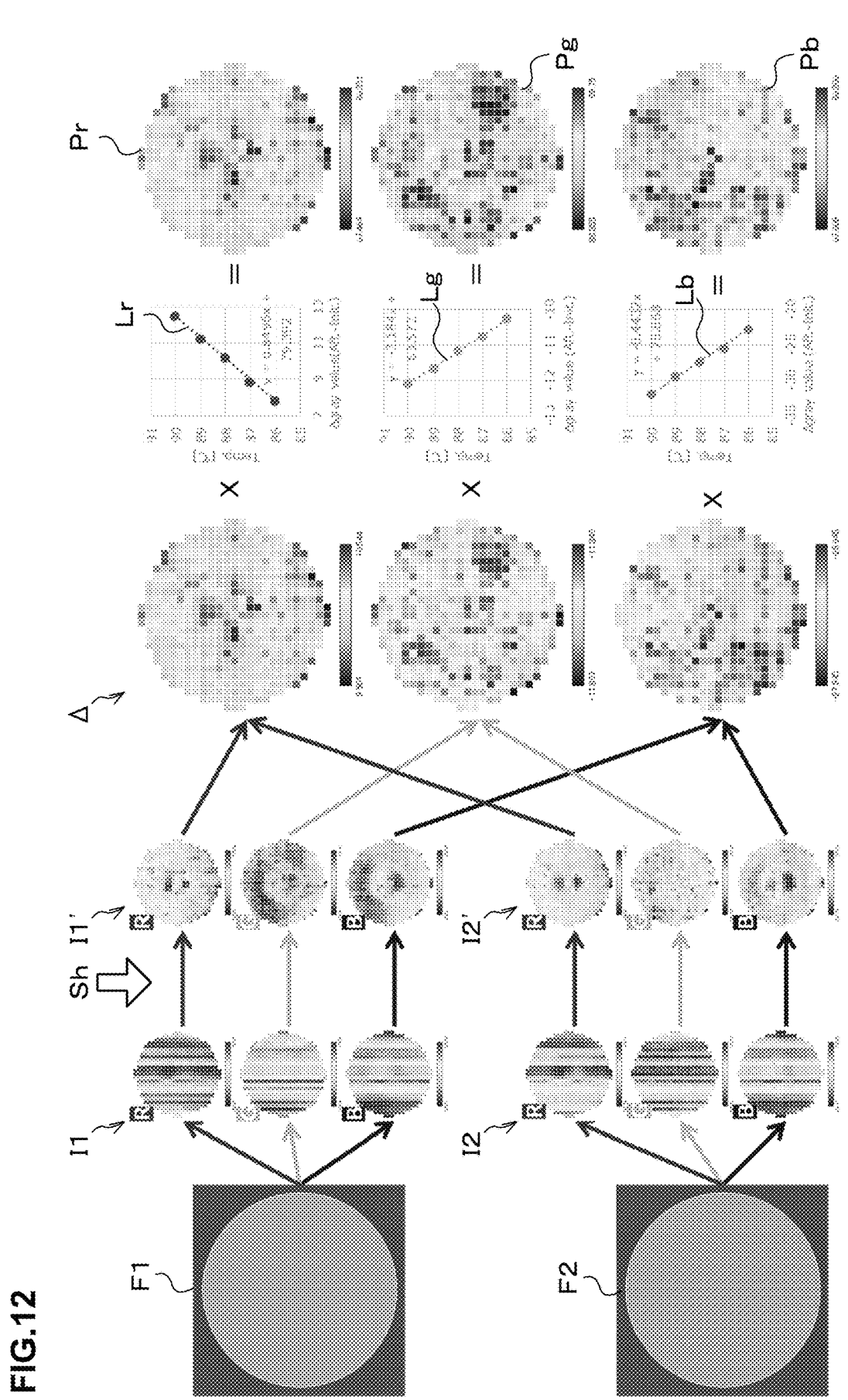
FIG. 12 is a conceptual view of a temperature distribution estimation method.

Subsequently, the adjustment processing of processing conditions of the PEB processing for making the processing result of the PEB processing uniform within the wafer will be explained using FIG. 11 and FIG. 12. FIG. 11 is a flowchart for explaining the adjustment processing of processing conditions of the PEB processing. FIG. 12 is a conceptual view of a temperature distribution estimation method. In the following example, in the adjustment processing of processing conditions of the PEB processing, the set temperature in each of the channels R1 to R5 of the hot plate 142 in the PEB processing is adjusted. Note that the adjustment processing is performed, for example, when introducing the substrate processing apparatus 1 and during the maintenance of the substrate processing apparatus 1.

(Transfer-In Step)

In the adjustment processing of processing conditions of the PEB processing, first, a wafer W for adjustment (hereinafter, referred to as an "adjustment wafer W") is transferred in (Step S1) as illustrated in FIG. 11. Specifically, for the adjustment processing, an operator mounts the cassette C housing the adjustment wafer W on the cassette stage 12, and the adjustment wafer W is taken out of the cassette C and transferred to the resist coating unit for the next step. Note that the adjustment wafer W is, for example, a bare wafer.

(Resist Film Forming Step)

Then, a resist film is formed on the adjustment wafer W (Step S2). Specifically, a resist film is formed on the adjustment wafer W under predetermined coating processing conditions in the resist coating unit 31.

(PAB Processing Step)

Thereafter, the PAB processing is performed on the adjustment wafer W (Step S3). Specifically, the adjustment wafer W on which the resist film is formed is transferred to the thermal processing unit 40 for PAB processing and subjected to the PAB processing under predetermined PAB processing conditions.

(Pre-Exposure Imaging Step)

Subsequently, the adjustment wafer W on which the resist film is formed and which is before subjected to later-explained uniform exposure processing is imaged (Step S4). Specifically, the adjustment wafer W subjected to the PAB processing is transferred to the defect inspection unit 61, in which its surface is imaged by the imager 210. Then, as illustrated in FIG. 12, the wafer W in an imaged result F1 is divided into, for example, 437 regions and, in each of the regions, an average value of luminance value of each of R (red), G (green), B (blue) is calculated. Then, a table is created in which the coordinates of each of the regions (pixels) and the average value of the luminance value of each of R, G, B are associated with each other for each region. Then, based on the created table, a captured image (hereinafter, referred to as a "pre-exposure captured image") I1 is acquired for each of R, G, B.

(Uniform Exposure Step)

After the acquisition of the captured image, uniform exposure processing is performed on the adjustment wafer W (Step S5). Specifically, the adjustment wafer W imaged at the pre-exposure imaging step at Step S4 is transferred to the exposure apparatus 4, and subjected to uniform exposure processing of exposing each of the regions of the wafer surface with a fixed exposure amount. In the exposure apparatus 4, in the uniform exposure processing, exposure is performed with the same exposure intensity and in the same exposure time, for example, without using a reticle, for each exposure region. Further, the exposure amount in each region of the wafer surface in the uniform exposure processing is less than an exposure amount in the actual processing, namely, in mass production of the resist pattern and, specifically, is set to ½ of the exposure amount in the actual processing.

(PEB Processing Step)

After the uniform exposure step, the PEB processing is performed on the adjustment wafer W (Step S6). Specifically, the adjustment wafer W subjected to the uniform exposure is transferred to the thermal processing unit 40 for the PEB processing which is an adjustment object of the processing conditions, in which the PEB processing is performed under the currently set PEB processing conditions.

(Post-PEB Imaging Step)

Subsequently, imaging of the adjustment wafer W is performed again (Step S7). Specifically, the undeveloped adjustment wafer W subjected to the PEB processing is transferred to the defect inspection unit 61, in which its surface is imaged by the imager 210. In this event, because the adjustment wafer W is undeveloped, what is image by the imager 210 is not a resist pattern but a latent image formed on the resist film on the wafer W. Then, based on an imaging result F2, a captured image (hereinafter, referred to as a "post-PEB captured image") I2 is acquired for each of R, G, B.

(Temperature Distribution Estimation Step)

Next, the controller 6 estimates an in-plane temperature distribution of the adjustment wafer W in the PEB processing, based on the imaging result at the pre-exposure imaging step and on the imaging result at the post-PEB imaging step (Step S8). Specifically, the controller 6 estimates the in-plane temperature distribution of the adjustment wafer W in the PEB processing based on color information of the pre-exposure captured image I1 acquired at the pre-exposure imaging step and on color information of the post-PEB captured image I2. Note that the color information is luminance information on a specific wavelength (color).

More specifically, the controller 6 first performs shading correction Sh on each of the pre-exposure captured images I1 of R, G, and B acquired at the pre-exposure imaging step and the post-PEB captured images I2 of R, G, and B acquired at the post-PEB imaging step. By the shading correction Sh, luminance unevenness due to the imaging conditions (the sensitivity of the imaging element, the optical system, and the moving speed of the stage 200 and so on) can be removed.

Subsequently, the controller 6 calculates a difference Δ in luminance value between a pre-exposure captured image I1' and a post-PEB captured image I2' which have been subjected to the shading correction for each of R, G, B and for each pixel in the captured image.

Then, the controller 6 acquires an in-plane temperature distribution Pr of the adjustment wafer W in the PEB processing from a calibration curve Lr indicating the relation between the difference Δr about R and a temperature and from the difference Δr about R calculated for each pixel.

Further, the controller 6 acquires an in-plane temperature distribution Pg of the adjustment wafer W in the PEB processing from a calibration curve Lg indicating the relation between the difference Δg about G and a temperature and from the difference Δg about G calculated for each pixel.

Further, the controller 6 acquires an in-plane temperature distribution Pb of the adjustment wafer W in the PEB processing from a calibration curve Lb indicating the relation between the difference Δb about B and a temperature and from the difference Δb about B calculated for each pixel.

Note that the calibration curves Lr, Lg, Lb are acquired in advance. The acquisition method will be explained later.

Further, the controller 6 selects one of the acquired three in-plane temperature distributions Pr, Pg, Pb of the adjustment wafer W in the PEB processing. For example, the in-plane temperature distribution of the adjustment wafer W in the PEB processing acquired based on the captured image about the wavelength, namely, color according to the film thickness of the resist film. More specifically, when the resist film is thick, the in-plane temperature distribution Pr acquired based on the captured image of R having a longer wavelength is selected, whereas when the resist film is thin, the in-plane temperature distribution Pb acquired based on the captured image of B having a shorter wavelength is selected. In short, the controller 6 estimates the in-plane temperature distribution of the adjustment wafer W in the PEB processing, based on the captured image about the wavelength according to the film thickness of the resist film. Note that when selecting the in-plane temperature distribution acquired based on the captured image about the wavelength according to the film thickness of the resist film as above, the acquisition of the in-plane temperature distributions based on the captured images about the other wavelengths may be omitted.

(Thermal Processing Condition Decision Step)

After the temperature distribution estimation step, the controller 6 decides the processing conditions of the PEB processing, based on the estimation result of the in-plane temperature distribution of the adjustment wafer W in the PEB processing (Step S9).

Specifically, the controller 6 decides the processing conditions of the PEB processing, based on the in-plane temperature distribution of the adjustment wafer W in the PEB processing selected at the temperature distribution estimation step. For example, the controller 6 decides the set temperature of each of the channels R1 to R5 of the hot plate 142 based on the following Expression (1) and, more specifically, decides a displacement amount (offset amount) from a reference temperature decided for each kind of the resist film, for each of the channels of the hot plate 142.

[Math. 1]

$$O = A \cdot T \tag{1}$$

$$O = \begin{bmatrix} ch_1 \\ ch_2 \\ ch_3 \\ \vdots \\ ch_n \end{bmatrix}$$

$$A = \begin{bmatrix} a_{11} & \cdots & a_{1m} \\ \vdots & \ddots & \vdots \\ a_{n1} & \cdots & a_{nm} \end{bmatrix}$$

$$T = \begin{bmatrix} t_1 \\ t_2 \\ t_3 \\ \vdots \\ t_m \end{bmatrix}$$

Note that in Expression (1), O is a matrix indicating the offset amount of each of the channels of the hot plate 142, T is a matrix indicating the in-plane temperature distribution of the adjustment wafer W in the PEB processing, and A is a transformation matrix.

Through use of the above Expression (1) and the like, the processing conditions of the PEB processing are decided so that the offset amount in a channel corresponding to a region where the estimated temperature in the PEB processing is lower than the reference temperature increases and the offset amount corresponding to a region where the estimated temperature in the PEB processing is higher than the reference temperature decreases, in the adjustment wafer W.

The decided processing conditions of the PEB processing are stored in a storage (not illustrated) and then used in the PEB processing in the subsequent actual processing.

(Removal Step)

Further, removal processing of the resist film formed on the adjustment wafer W is performed (Step S10). Specifically, the adjustment wafer W imaged at the post-PEB imaging step is transferred to the resist coating unit 31 as a remover, in which a discharge nozzle (not illustrated) which discharges a thinner liquid supplies the thinner liquid to the adjustment wafer W to peel off the resist film on the adjustment wafer W. Note that a unit for removal processing may be provided separately from the resist coating unit 31 or the like.

(Post-Removal Imaging Step)

Subsequently, imaging of the adjustment wafer W is performed again (Step S11). Specifically, the adjustment wafer W from which the resist film has been removed is transferred to the defect inspection unit 61, in which its surface is imaged by the imager 210, whereby a substrate image indicating the state of the wafer surface is acquired.

(Reuse Determination Step)

Next, the controller 6 determines whether the adjustment wafer W is reusable, based on the substrate image acquired at the post-removal imaging step (Step S12). Specifically, the controller 6 compares the substrate image of the adjustment wafer W acquired at the post-removal imaging step with the substrate image of the bare wafer in an unprocessed state acquired in advance, and determines whether the adjustment wafer W is reusable, based on the comparison result.

(Report Step)

If not reusable (in the case of NO at Step S12), the controller 6 makes a report of the impossibility of reuse (Step S13). Specifically, the controller 6 causes a display unit (not illustrated) to display, for example, a warning that the adjustment wafer W is not reusable.

(Transfer-Out Step)

If reusable (in the case of YES at Step S12) or after the report step at Step S11, the controller 6 transfers out the adjustment wafer W (Step S14). Specifically, the adjustment wafer W is returned by the wafer transfer unit 21 to the original cassette C on the cassette stage 12. Note that if not reusable, the adjustment wafer may be transferred to a cassette C for discard separately mounted on the cassette stage 12.

With the above, the adjustment processing of the processing conditions of the PEB processing is completed.

In the actual processing after the completion of the adjustment processing of the processing conditions of the PEB processing, the PEB processing is performed under the processing conditions decided by the adjustment processing.

Figure 13:
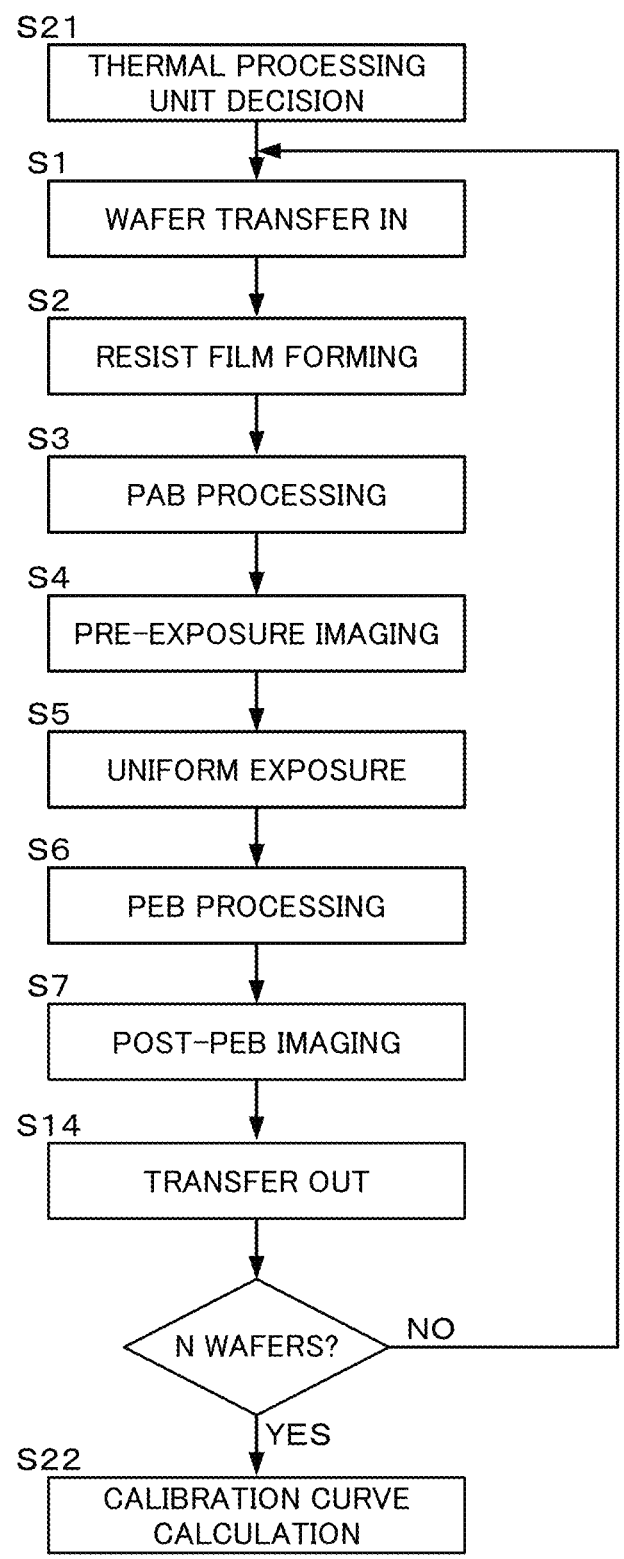
FIG. 13 is a flowchart for explaining an acquisition method of calibration curves about a wafer temperature in the PEB processing.

Subsequently, the acquisition method of the aforementioned calibration curves Lr, Lg, Lb will be explained using FIG. 13. FIG. 13 is a flowchart for explaining the acquisition method of the calibration curves Lr, Lg, Lb.

When acquiring the calibration curves Lr, Lg, Lb, for example, one of the plurality of thermal processing units 40 for the PEB processing, which is to be used for acquiring the calibration curves is decided according to the user input or the like (Step S21).

(Transfer-In Step)

Subsequently, a wafer W for acquiring the calibration curve (hereinafter, referred to as a "calibration curve acquisition wafer W") is transferred in similarly at Step S1. Note that the calibration curve acquisition wafer W is a bare wafer.

(Resist Film Formation Step)

Next, a resist film is formed on the calibration curve acquisition wafer W similarly at Step S2.

(PAB Processing Step)

Thereafter, PAB processing is performed on the calibration curve acquisition wafer W similarly at Step S3.

(Pre-Exposure Imaging Step)

Subsequently, the calibration curve acquisition wafer W is imaged similarly at Step S4.

(Uniform Exposure Step)

Subsequently, uniform exposure processing is performed on the calibration curve acquisition wafer W similarly at Step S5.

(PEB Processing Step)

After the uniform exposure step, PEB processing is performed on the calibration curve acquisition wafer W similarly at Step S6. Note that the PEB processing is performed in the thermal processing unit 40 decided at Step S21.

(Post-PEB Imaging Step)

Subsequently, imaging of the calibration curve acquisition wafer W is performed similarly at Step S7.

(Transfer-Out Step)

Then, the calibration curve acquisition wafer W is transferred out similarly at Step S14.

The steps from the above transfer-in step at Step S1 to the transfer-out step at Step S14 are performed on each of a plurality of (N) calibration curve acquisition wafers W. However, the temperature of the hot plate 142 in the PEB processing is different for each of the calibration curve acquisition wafers W. Note that the temperature in each of the channels R1 to R5 of the hot plate 142 is common.

(Calibration Curve Calculation Step)

Then, the calibration curves Lr, Lg, Lb are calculated based on the captured image acquired at the pre-exposure imaging step and on the captured image acquired at the post-PEB imaging step for the plurality of calibration curve acquisition wafers W. Specifically, in the case of the calibration curve Lr, first, an average R luminance within the wafer in the captured image at the pre-exposure imaging step is set as a gray value Ir1 and an average R luminance within the wafer in the captured image at the post-PEB imaging step is set as a gray value Ir2, and a gray value change amount $\Delta Ir$ (=Ir2−Ir1) is calculated for each temperature of the hot plate 142 at the PEB processing step. Then, using the gray value change amount as an explanatory variable and using the temperature of the hot plate 142 in the PEB processing as an objective variable, an approximated curve of the temperature of the hot plate 142 with respect to the gray value change amount is acquired and regarded as the calibration curve Lr.

The calibration curves Lg, Lb are also similarly acquired as with the calibration curve Lr.

As explained above, the adjustment processing of the PEB processing conditions according to the embodiment includes: a pre-exposure imaging step of imaging an adjustment wafer W before a uniform exposure processing on which a resist film is formed; a PEB processing step of performing PEB processing on the adjustment wafer W subjected to the uniform exposure processing after the pre-exposure imaging step; a post-PEB imaging step of imaging the adjustment wafer W subjected to the PEB processing; a temperature distribution estimation step of estimating an in-plane temperature distribution of the adjustment wafer in the PEB processing based on an imaging result at the pre-exposure imaging step and on an imaging result at the post-PEB imaging step; and a PEB processing condition decision step of deciding processing conditions in the PEB processing based on an estimation result of the in-plane temperature distribution of the adjustment wafer. Accordingly, in this embodiment, the processing conditions of the PEB processing are decided based not on the in-plane temperature distribution of the line width of the resist pattern but on the in-plane temperature distribution of the adjustment wafer W estimated from the imaging result after the PEB processing is actually performed under the currently set processing conditions. Therefore, according to this embodiment, the PEB processing can be performed so that the processing result (namely, the temperature of the wafer W) becomes uniform within the wafer. Accordingly, a resist pattern with higher in-plane uniformity of the line width can be formed.

Further, according to this embodiment, the temperature of the wafer W can be made uniform at the reference temperature set for each kind of the resist film within the wafer W, for each of the thermal processing units 40 for the PEB processing. Accordingly, the variation in temperature of the wafer W can be suppressed among the thermal processing units 40 for the PEB processing.

Further, in this embodiment, the controller 6 selects the in-plane temperature distribution of the adjustment wafer W in the PEB processing, acquired based on the captured image about the wavelength according to the film thickness of the resist film from the acquired three in-plane temperature distributions Pr, Pg, Pb of the adjustment wafer W in the PEB processing as explained above. In other words, the controller 6 estimates the in-plane temperature distribution of the adjustment wafer W in the PEB processing, based on the captured image about one wavelength according to the film thickness of the resist film. Accordingly, the in-plane temperature distribution in the PEB processing can be more accurately estimated, and the PEB processing result can be made more uniform within the wafer.

Note that when the controller 6 selects one of the three in-plane temperature distributions Pr, Pg, Pb of the adjustment wafer W in the PEB processing, the selection may be performed as follows. For example, a temperature sensor may be provided for the hot plate 142 in advance, so that the in-plane temperature distribution in which the measurement result by the temperature sensor is closest to the estimated temperature of the pixel corresponding to the arrangement position of the temperature sensor is selected.

Further, the controller 6 may estimate one in-plane temperature distribution of the adjustment wafer W in the PEB processing, based on the captured images of all of R, G, B using the following Expression (2).

[Math. 2]

$$t = \mathbb{S}_i \cdot \mathbb{L} + C \quad (2)$$

$$\mathbb{J} = \begin{bmatrix} J_R \\ J_G \\ J_B \end{bmatrix}, \mathbb{K} = \begin{bmatrix} K_R \\ K_G \\ K_B \end{bmatrix}, \mathbb{L} = \begin{bmatrix} L_R \\ L_G \\ L_B \end{bmatrix}$$

$$\mathbb{L} = \mathbb{K} - \mathbb{J}$$

$$\mathbb{S}_i = [S_{iR} \ S_{iG} \ S_{iB}]$$

$t$ = estimated temperature
$\mathbb{J}$ = luminance value of pre-exposed captured image
$\mathbb{K}$ = luminance value of post-PEB captured image
$\mathbb{L}$ = change amount in luminance value
$\mathbb{S}_i$ = temperature sensitivity matrix
$C$ = Constant When a temperature sensitivity matrix has film thickness dependence, the controller 6 may estimate the in-plane temperature distribution of the adjustment wafer W in the PEB processing using the following Expression (3).

[Math. 3]

$$t = (\mathbb{S}_i \cdot (\mathbb{S}_{if} \cdot f)) \cdot \mathbb{L} + C \quad (3)$$

$$\mathbb{S}_{if} = \begin{bmatrix} S_{ifR} & 0 & 0 \\ 0 & S_{ifG} & 0 \\ 0 & 0 & S_{ifB} \end{bmatrix}$$

$$f = \mathbb{S}_f \cdot \mathbb{J} + C$$

$$S_f = [S_{fR} \ S_{fG} \ S_{fB}]$$

$f$ = film thickness
$\mathbb{S}_f$ = film thickness sensitivity matrix
$\mathbb{S}_{if}$ = film thickness sensitivity matrix of temperature sensitivity Furthermore, in this embodiment, the exposure amount in each of the regions of the wafer surface in the uniform exposure processing is set to be less than an exposure amount in the actual processing, for example, to ½. Therefore, when the PEB processing is performed in the adjustment processing of processing conditions of the PEB processing, the change amount of the film thickness of the resist film between before and after the PEB processing becomes large depending on the difference in the result of the PEB processing. As a result, depending on the difference in the result of the PEB processing, the change amount in luminance in the captured image between before and after the PEB processing becomes large. In other words, even if the difference in the result of the PEB processing is small, the difference in luminance between the pre-exposure captured image and the post-PEB captured image becomes large. Accordingly, it is possible to estimate with high accuracy the in-plane temperature distribution of the adjustment wafer W in the PEB processing, based on the pre-exposure captured image and the post-PEB captured image. Note that ½ of the exposure amount in the actual processing corresponds to the amount of exposure applied to an edge portion of the resist pattern.

Further, in this embodiment, whether the adjustment wafer W from which the resist film has been removed is reusable is determined based on the substrate image acquired at the post-removal captured image. Accordingly, the consumption of the adjustment wafer W can be reduced without deteriorating the adjustment accuracy of the processing conditions.

Note that in this embodiment, a bare wafer is used as the adjustment wafer W. Accordingly, the processing conditions of the PEB processing can be appropriately decided.

Second Embodiment

Figure 14:
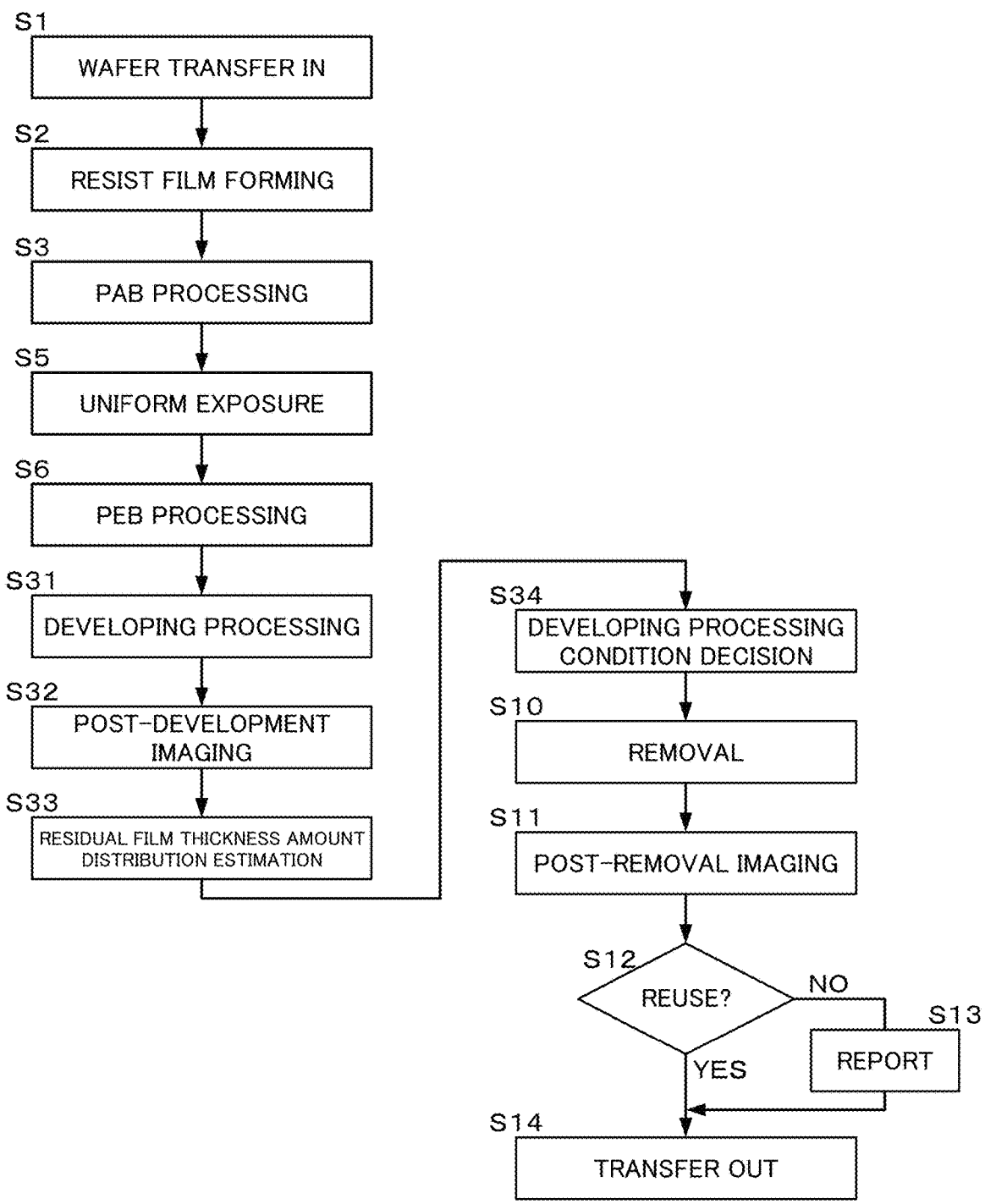
FIG. 14 is a flowchart for explaining adjustment processing of processing conditions according to a second embodiment.

FIG. 14 is a flowchart for explaining adjustment processing of processing conditions according to a second embodiment.

The processing conditions of the PEB processing are adjusted in the first embodiment, whereas the processing conditions of the developing processing are adjusted in this embodiment. The adjustment processing of the processing conditions of the developing processing is performed, for example, subsequent to the adjustment of the processing conditions of the PEB processing. Note that the adjustment of the processing conditions of the PEB processing is performed when introducing the substrate processing apparatus 1 as explained above, and therefore the adjustment processing of the processing conditions of the developing processing is to be performed also at the same timing. However, it is possible to perform adjustment processing of the processing conditions of the developing processing without performing the adjustment of the processing conditions of the PEB processing.

(Transfer-In Step)

In the adjustment processing of the processing conditions of the developing processing, first, an adjustment wafer W is transferred in similarly at above Step S1.

(Resist Film Formation Step)

Next, a resist film is formed on the adjustment wafer W similarly at above Step S2.

(PAB Processing Step)

Thereafter, PAB processing is performed on the adjustment wafer W similarly at above Step S3 (Step S3).

(Uniform Exposure Step)

Subsequently, uniform exposure processing is performed on the adjustment wafer W similarly at above Step S5. Also in the adjustment processing of the processing conditions of the developing processing, the exposure amount in each of the regions of the wafer surface in the uniform exposure processing is set to be less than an exposure amount in the actual processing, for example, to ½.

(PEB Processing Step)

After the uniform exposure step, the PEB processing is performed on the adjustment wafer W similarly at above Step S6. However, if the processing conditions of the PEB processing have been adjusted, the PEB processing is performed under the adjusted PEB processing conditions.

(Developing Processing Step)

Thereafter, the developing processing is performed on the adjustment wafer W (Step S31). Specifically, the adjustment wafer W subjected to the PEB processing is transferred to the developing processing unit 30 which is an adjustment object of the processing conditions, in which the developing processing is performed under the currently set developing processing conditions.

(Post-Development Imaging Step)

Subsequently, imaging of the adjustment wafer W is performed again (Step S32). Specifically, the adjustment wafer W subjected to the developing processing is transferred to the defect inspection unit 61, in which its surface is imaged by the imager 210, whereby a captured image (hereinafter, referred to as a "post-development captured image") I3 is acquired.

(Residual Film Thickness Amount Distribution Estimation Step)

Next, the controller 6 estimates an in-plane distribution of the film thickness of the resist film after the developing processing (hereinafter, referred to as a "residual film thickness amount of the resist film") on the adjustment wafer W, based on an imaging result at the post-development imaging step (Step S33).

Specifically, the controller 6 calculates, namely, estimates the in-plane distribution of the residual film thickness amount of the resist film of the adjustment wafer W, based on the color information of the post-development captured image I3 for B (blue).

More specifically, the controller 6 calculates the residual film thickness amount of the resist film based on the luminance and a calibration curve Ldev acquired in advance for each pixel in the post-development captured image I3 about B to acquire the in-plane distribution of the residual film thickness amount.

Note that the calibration curve Ldev indicates the relation between the luminance in the post-development captured image I3 about B and the residual film thickness amount of the resist film. The acquisition method of the calibration curve Ldev will be explained later.

The in-plane distribution of the residual film thickness amount is calculated based on the captured image about B here, but the in-plane distribution of the residual film thickness amount may be calculated based on the captured image about G or the captured image about R. Further, as with the estimation of the in-plane temperature distribution of the adjustment wafer W in the PEB processing, the in-plane distribution of the residual film thickness amount may be estimated based on the captured image about the wavelength according to the film thickness of the resist film.

(Developing Processing Condition Decision Step)

After the residual film thickness amount distribution estimation step, the controller 6 decides the processing conditions of the developing processing based on the estimation result of the in-plane distribution of the residual film thickness amount of the resist film (Step S34).

Specifically, the controller 6 decides and corrects the supply time of the developing solution as the processing conditions of the developing processing, for example, based on the in-plane distribution of the residual film thickness amount of the resist film on the adjustment wafer W.

More specifically, the controller 6 decides the processing conditions of the developing processing so that when the residual film thickness amount of the resist film is close to the target amount and is appropriate at a wafer central portion and is larger than the target amount at a wafer outer peripheral portion in the adjustment wafer W, the supply of the developing solution to the wafer outer peripheral portion is added. A length of time Δt of the additional supply of the developing solution to the wafer outer peripheral portion is calculated from, for example, a correction curve Lamd indicating the relation between the supply time of the developing solution and the residual film thickness amount.

Note that the correction curve Lamd is acquired in advance. The acquisition method thereof will be explained later.

By setting the length of time Δt of the additional supply of the developing solution to the wafer outer peripheral portion as explained above, the residual film thickness amount of the resist film at the wafer outer peripheral portion can also be made an appropriate value close to the target amount.

Note that the calculated length of time Δt of the additional supply of the developing solution to the wafer outer peripheral portion, namely, the decided processing condition of the developing processing is stored in the storage (not illustrated), and used in the developing processing in the actual processing thereafter.

Further, the similar steps as those at above Step S10 to Step S14 are performed, with which the adjustment processing of the processing conditions of the developing processing is completed.

Figure 15:
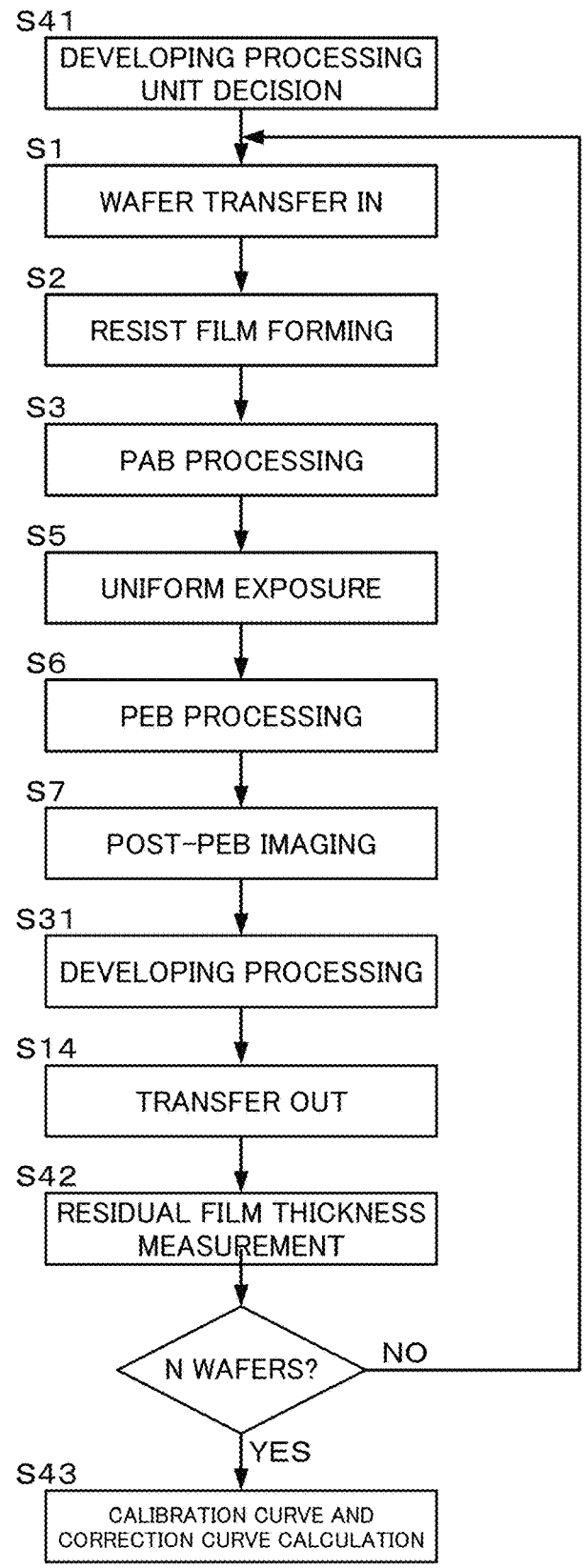
FIG. 15 is a flowchart for explaining an acquisition method of a calibration curve about a film thickness of a resist film after the developing processing and a correction curve for deciding developing processing conditions.

Subsequently, the acquisition method of the above calibration curve Ldev and correction curve Lamd will be explained using FIG. 15. FIG. 15 is a flowchart for explaining the acquisition method of the calibration curve Ldev and the correction curve Lamd.

When acquiring the calibration curve Ldev, first, one of the plurality of developing processing units 30, which is to be used for acquiring the calibration curve and the correction curve is decide according to the user input or the like (Step S41).

(Transfer-In Step)

Subsequently, a wafer W for acquiring the calibration curve and the correction curve (hereinafter, referred to as a "calibration curve acquisition wafer W") is transferred in similarly at Step S1. Note that the calibration curve acquisition wafer W is also a bare wafer.

(Resist Film Formation Step)

Next, a resist film is formed on the calibration curve acquisition wafer W similarly at Step S2.

(PAB Processing Step)

Thereafter, PAB processing is performed on the calibration curve acquisition wafer W similarly at Step S3.

(Uniform Exposure Step)

Subsequently, uniform exposure processing is performed on the calibration curve acquisition wafer W similarly at Step S5.

(PEB Processing Step)

After the uniform exposure step, the PEB processing is performed on the calibration curve acquisition wafer W similarly at Step S6.

(Developing Processing Step)

Thereafter, similarly at Step S31, the developing processing is performed on the calibration curve acquisition wafer W. Note that the developing processing is performed in the developing processing unit 30 decided at Step S41, and the developing solution is supplied from the coating nozzle 122 only to the wafer central portion during spin coating of the developing solution.

(Post-Development Imaging Step)

Subsequently, imaging of the calibration curve acquisition wafer W is performed similarly at Step S32. Thus, a captured image about at least B is acquired.

(Transfer-Out Step)

Then, the calibration curve acquisition wafer W is transferred out similarly at Step S14.

(Residual Film Thickness Amount Measurement Step)

Thereafter, the residual film thickness amount of the resist film on the calibration curve acquisition wafer W is acquired (Step S42). Specifically, for example, the calibration curve acquisition wafer W subjected to the PEB processing is transferred to an external film thickness measurement apparatus (not illustrated), in which the residual film thickness amount of the resist film at the wafer central portion is measured. Note that the measurement of the residual film thickness amount may be performed in a film thickness measurement apparatus which is provided in the substrate processing apparatus 1.

(Calibration Curve and Correction Curve Calculation Step)

Then, a calibration curve Lpeb and a correction curve Lamd are calculated based on the captured image of the calibration curve acquisition wafer W acquired at the post-development imaging step, about a plurality of calibration curve acquisition wafers W (Step S43). Specifically, in the case of the calibration curve Lpeb, using B luminance in the captured image at the post-development imaging step as an explanatory variable and using the residual film thickness amount of the resist film acquired at the residual film thickness amount measurement step as an objective variable, an approximated curve of the residual film thickness amount with respect to the B luminance change amount is acquired and regarded as the calibration curve Lpeb. Further, in the case of the correction curve Lamd, using the supply time of the developing solution at the developing step as an explanatory variable and using the residual film thickness amount of the resist film acquired at the residual film thickness amount measurement step as an objective variable, an approximated curve of the residual film thickness amount of the resist film with respect to the supply time of the developing solution is acquired and regarded as the correction curve Lamd.

As explained above, in this embodiment, the developing processing is actually performed at the currently set processing conditions, and the processing conditions of the developing processing are decided based on the in-plane distribution of the film thickness of the resist film after the developing processing estimated from the processing result. Therefore, according to this embodiment, the developing processing can be performed so that the processing result becomes uniform within the wafer. Accordingly, a resist pattern with higher in-plane uniformity of the line width can be formed.

Further, in this embodiment, the exposure amount in each of the regions of the wafer surface in the uniform exposure processing is set to be less than an exposure amount in the actual processing, for example, to ½. Therefore, when the developing processing is performed in the adjustment processing of the processing conditions of the developing processing, the film thickness of the resist film after the developing processing greatly differs depending on the difference in developing processing result. As a result, the luminance in the captured image after the developing processing greatly differs depending on the difference in the developing processing result. In other words, even if the difference in the developing processing result is small, the difference in luminance in the post-development captured image greatly differs. Accordingly, it is possible to estimate with high accuracy the in-plane distribution of the film thickness of the resist film after the developing processing, based on the post-development captured image.

Third Embodiment

Figure 16:
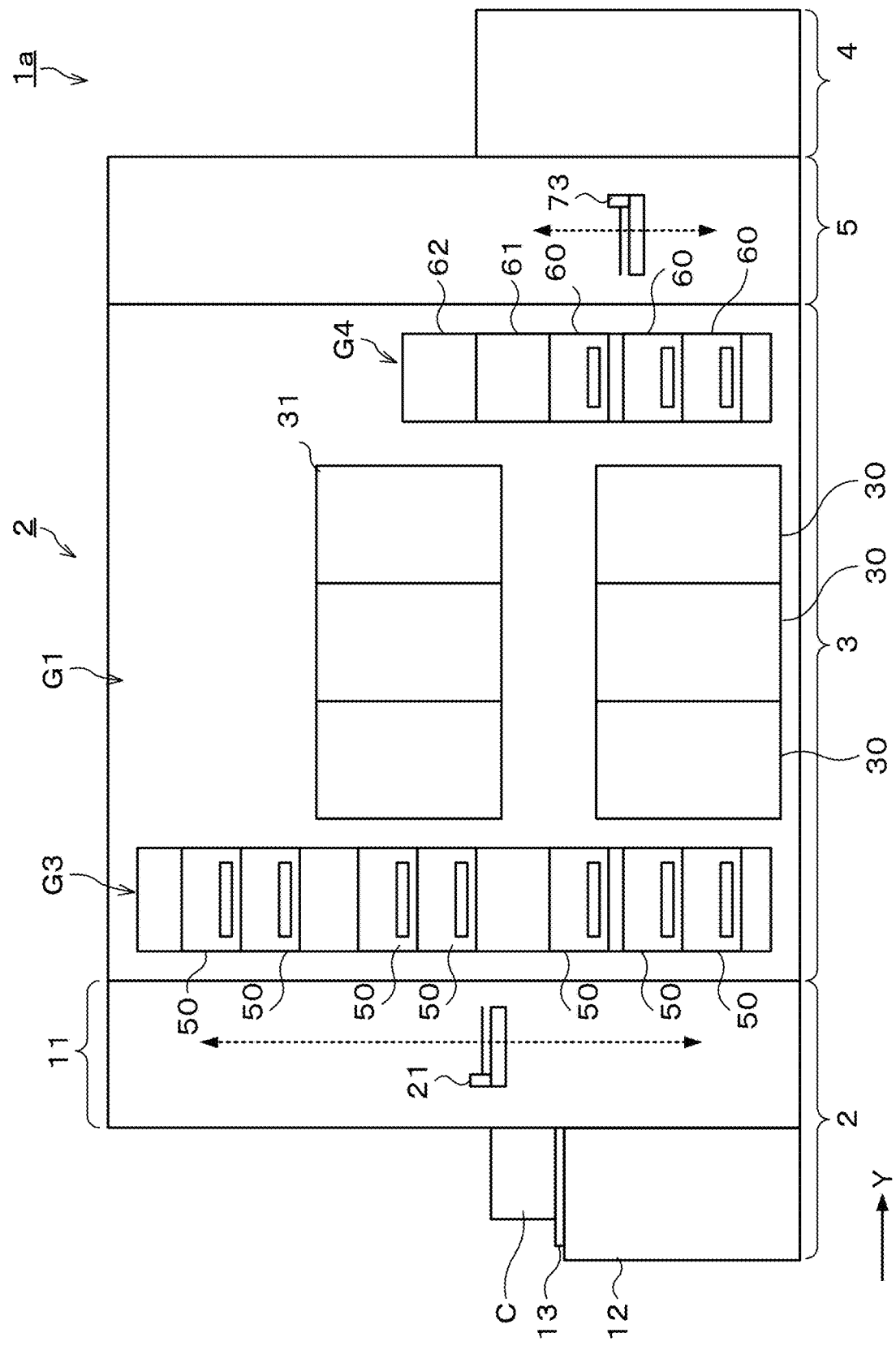
FIG. 16 is a front view illustrating the outline of an internal configuration of a substrate processing apparatus according to a third embodiment.

FIG. 16 is a front view illustrating the outline of an internal configuration of a substrate processing apparatus 1a according to a third embodiment.

In the first embodiment, the uniform exposure processing is performed in the external exposure apparatus 4 adjacent to the substrate processing apparatus 1 and performing exposure in the actual processing. In contrast to the above, in this embodiment, the substrate processing apparatus 1a has an exposure unit 62 independent from the exposure apparatus 4 as illustrated in FIG. 16. The exposure unit 62 performs the uniform exposure processing on the adjustment wafer W.

With this configuration, the adjustment processing of the processing conditions can be completed in the substrate processing apparatus 1 without using the external exposure apparatus.

Note that the exposure unit 62 is provided, for example, on the defect inspection unit 61 in the fourth block G4.

Fourth Embodiment

Figure 17:
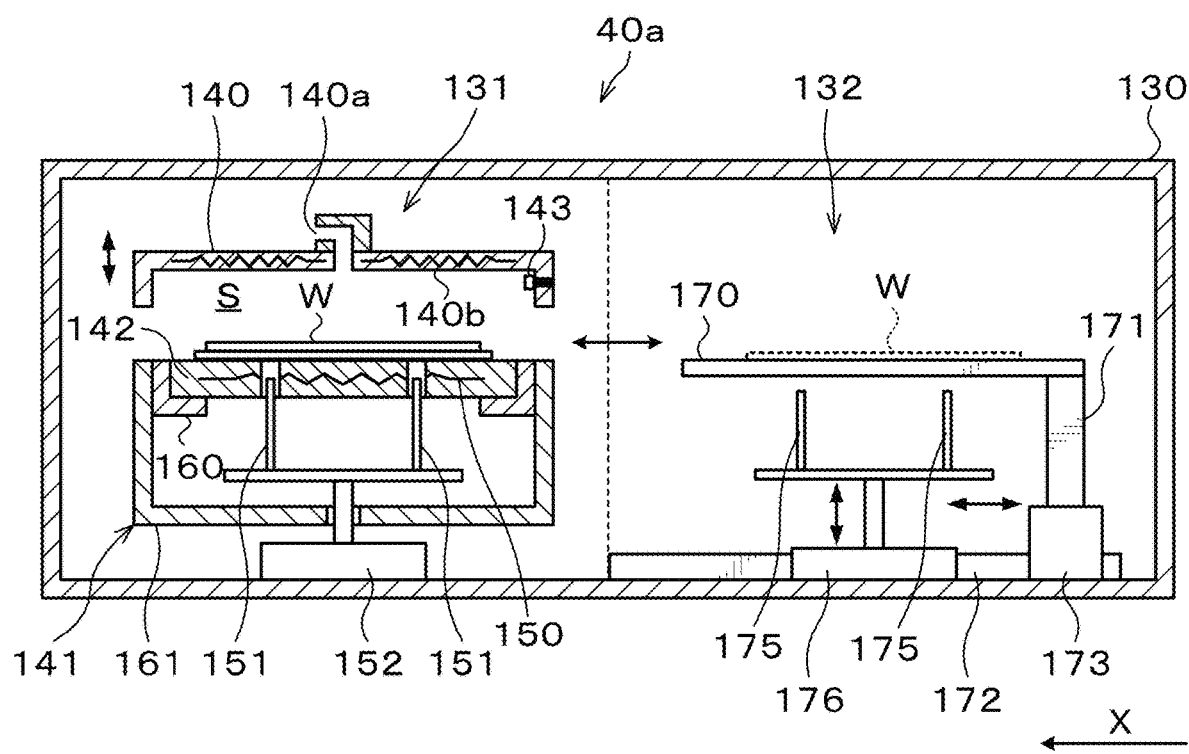
FIG. 17 is a longitudinal sectional view illustrating the outline of a configuration of a thermal processing unit of a substrate processing apparatus according to a fourth embodiment.

FIG. 17 is a longitudinal sectional view illustrating the outline of a configuration of a thermal processing unit 40a of a substrate processing apparatus according to a fourth embodiment.

The thermal processing unit 40a according to this embodiment has a heater 140b as a temperature regulation mechanism which regulates the temperature of the lid 140, which is provided at the lid 140.

The processing condition of the hot plate 142 in the PEB processing in the actual processing such as the offset amount of each channel of the hot plate 142 is adjusted in the above first embodiment and so on, but the wafer temperature in the above PEB processing is lower or higher than the desired temperature as a whole in some cases only by adjusting the condition of the hot plate 142. In these cases, the provision of the heater 140b which regulates the temperature of the lid 140 as in this embodiment makes it possible to set the temperature of the wafer W in the above PEB processing in the actual processing to the desired temperature. This is because the wafer W is affected by radiation heat of the lid 140.

Further, if the heater 140b is not provided unlike this embodiment, the temperature of the lid 140 in the PEB processing may be different, for example, between in the adjustment processing time of the condition of the hot plate 142 in the PEB processing and in the actual processing time. The provision of the heater 140b can make the temperature of the lid 140 in the PEB processing the same between in the adjustment processing time and in the actual processing time. Since the wafer W is affected by radiation heat of the lid 140 as explained above, the wafer in-plane uniformity in the PEB processing result in the actual processing time after the adjustment can be improved more in the case where the temperature of the lid 140 in the PEB processing is the same between in the adjustment processing time and in the actual processing time than in the case where the temperature of the lid 140 in the PEB processing is different therebetween.

Modification Example of the First Embodiment

In the first embodiment, the PEB processing is performed based on the processing conditions decided by the adjustment processing, namely, the offset amount of each channel of the hot plate 142 decided by the above adjustment processing, in the actual processing after the completion of the adjustment processing of the processing conditions of the PEB processing.

On the other hand, in this modification example, the offset amount decided by the above adjustment processing is corrected based on the temperature measurement result of the lid 140 of the thermal processing unit 40 by the temperature sensor 143 and then used in the PEB processing. This is because the wafer W is affected by radiation heat of the lid 140 as explained above.

Modification Example of the First Embodiment

In the first embodiment, the adjustment processing of the processing conditions of the PEB processing is performed when introducing the substrate processing apparatus 1 and during the maintenance of the substrate processing apparatus 1. The execution timing of the adjustment processing of the processing conditions of the PEB processing is not limited to the above. For example, the controller 6 may measure the film thickness of the resist film formed in the actual processing and start the adjustment processing of the processing conditions of the PEB processing based on the measurement result. Specifically, when the variation within the wafer of the measured film thickness of the resist film or the average value within the wafer of the film thickness exceeds the threshold value, the adjustment processing of the processing conditions of the PEB processing may be started.

Note that the measurement of the film thickness of the resist film can be performed as follows. Specifically, the wafer W on which the resist film is formed after the PEB processing in the actual processing can be imaged by the imager 210 of the defect inspection unit 61, and the film thickness of the resist film can be measured/estimated based on the captured image acquired from the imaging result.

Modification Examples of the First to Fourth Embodiments

The execution timing of the adjustment processing of the processing conditions of the PEB processing and the developing processing may be as follows. Specifically, for example, the controller 6 may estimate the line width of the resist pattern formed in the actual processing and start the adjustment processing of the processing conditions of the PEB processing and the developing processing based on the estimation result. More specifically, when the variation within the wafer of the estimated line width or the average value within the wafer of the estimated line width exceeds the threshold value, the adjustment processing of the processing conditions may be started.

Note that the estimation of the line width of the resist pattern can be performed as follows. Specifically, the wafer W on which the resist pattern is formed after the developing processing in the actual processing is imaged by the imager 210 of the defect inspection unit 61, and the line width of the resist pattern can be estimated based on the captured image acquired from the imaging result.

Further, the adjustment wafer W is mounted on the cassette stage 12 while being housed in the cassette C by the operator in the adjustment of the processing conditions, but may be stored in the container in the substrate processing apparatus 1.

Fifth Embodiment

Figure 18:
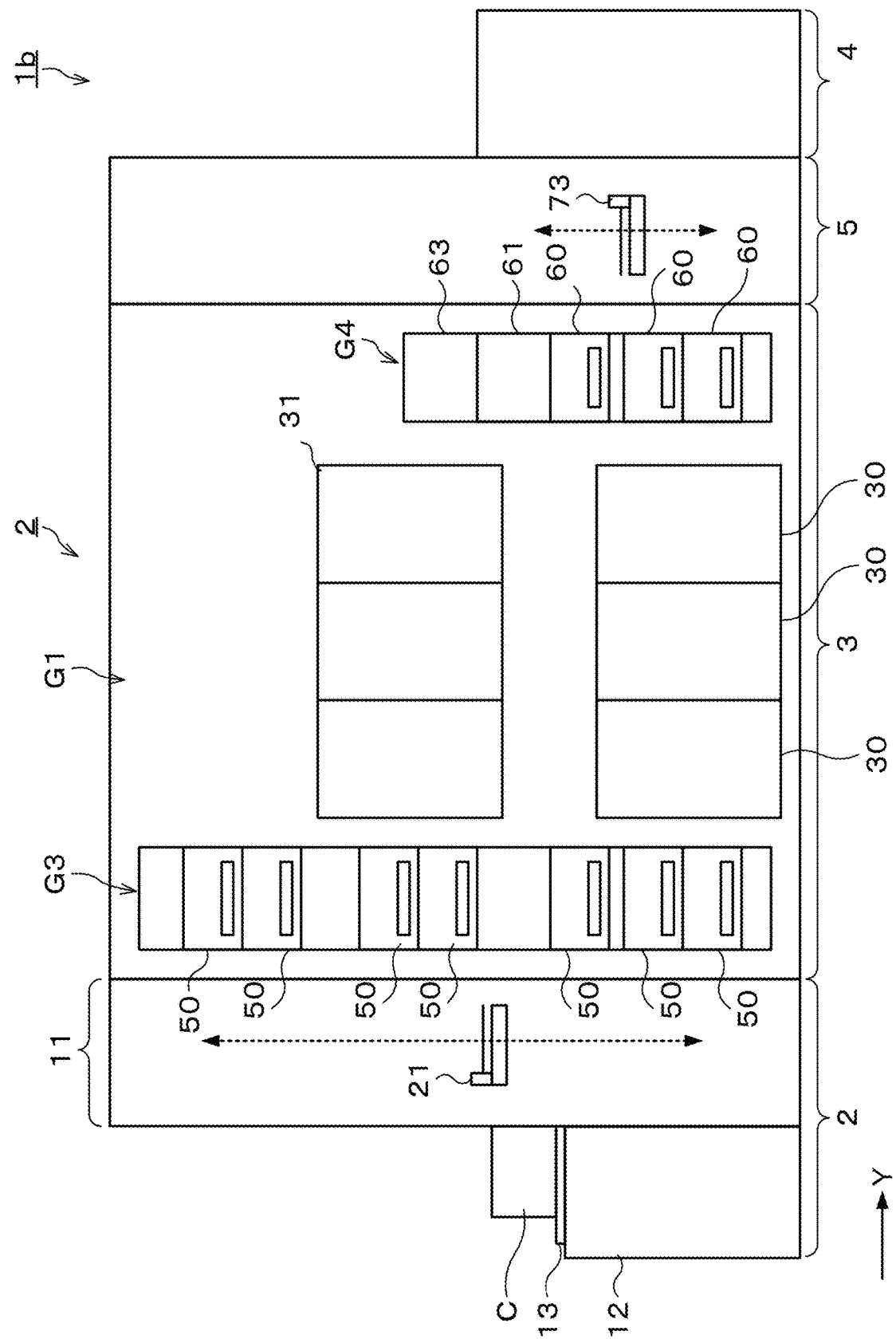
FIG. 18 is a front view illustrating the outline of an internal configuration of a substrate processing apparatus according to a fifth embodiment.

FIG. 18 is a front view illustrating the outline of an internal configuration of a substrate processing apparatus 1b according to a fifth embodiment.

As illustrated, the substrate processing apparatus 1b has an inspection unit 63. The defect inspection unit 61 is intended to image the entire surface of the wafer W for inspection, whereas the inspection unit 63 captures only an edge portion of the wafer W for inspection.

In this embodiment, the controller 6 executes the adjustment processing of the processing conditions of the edge exposure processing by the edge exposure unit 41. Further, the execution timing of the adjustment processing of the processing conditions of the edge exposure processing is decided as follows. Specifically, after the edge exposure processing in the actual processing, the edge portion of the wafer W is imaged by an imager (not illustrated) of the inspection unit 63, and the adjustment processing of the processing conditions of the edge exposure processing is started based on the imaging result. For example, based on the imaging result, an edge exposure width by the exposure processing is estimated, and when there is an abnormality in the estimated edge exposure width, the adjustment processing of the processing conditions of the edge exposure processing is started.

The adjustment processing of the processing conditions started based on the imaging result of the edge portion of the wafer W is not limited to the adjustment processing of the processing conditions of the edge exposure processing but may be adjustment processing of the processing conditions of other processing on the edge portion of the wafer. The other processing on the edge portion of the wafer is, for example, EBR processing (processing of removing a film at the outer edge portion of the wafer W) and edge coating processing (processing of coating only the edge portion of the wafer W). In the adjustment processing of the processing conditions of the edge exposure processing, the EBR processing, and the edge coating processing, for example, an origin position of each of the processing is adjusted.

The embodiments disclosed herein are examples in all respects and should not be considered to be restrictive. Various omissions, substitutions and changes may be made in the embodiments without departing from the scope and spirit of the attached claims.

Note that the following configurations also belong to the technical scope of this disclosure.

(1) A substrate processing apparatus which processes a substrate, including:
 a thermal processor configured to perform thermal processing on the substrate;
 an imager configured to image the substrate; and
 a controller, wherein:
 the controller is configured to execute adjustment processing of adjusting conditions of processing on the substrate; and the adjustment processing includes:
- a pre-exposure imaging step of controlling the imager to image an unexposed adjustment substrate on which a resist film is formed;
- a thermal processing step of controlling the thermal processor to perform the thermal processing on the adjustment substrate subjected to uniform exposure processing of exposing each region of a substrate surface with a fixed exposure amount after the pre-exposure imaging step;
- a post-heating imaging step of controlling the imager to image the adjustment substrate after the thermal processing step;
- a temperature distribution estimation step of estimating an in-plane temperature distribution of the adjustment substrate in the thermal processing based on an imaging result at the pre-exposure imaging step and on an imaging result at the post-heating imaging step; and
- a thermal processing condition decision step of deciding processing conditions of the thermal processing based on an estimation result of the in-plane temperature distribution of the adjustment substrate.

According to the (1), the thermal processing is actually performed, and the processing conditions of the thermal processing are decided based on the in-plane temperature distribution of the adjustment substrate estimated from an imaging result after the processing. Therefore, according to this embodiment, the thermal processing can be performed so that its processing result (namely, a temperature of the substrate) becomes uniform within the substrate. Accordingly, a resist pattern with higher in-plane uniformity of the line width can be formed.

(2) The substrate processing apparatus according to the (1) further including an exposurer configured to perform the uniform exposure processing different from an external exposure apparatus configured to perform exposure processing in actual processing.

According to the (2), the adjustment processing of the processing conditions can be completed in the substrate processing apparatus without using an external exposure apparatus.

(3) The substrate processing apparatus according to the (1), wherein the uniform exposure processing is performed by an external exposure apparatus configured to perform exposure processing in actual processing.

(4) The substrate processing apparatus according to any one of the (1) to (3), wherein the fixed exposure amount is less than an exposure amount in the actual processing.

(5) The substrate processing apparatus according to any one of the (1) to (4), wherein:
- each of the pre-exposure imaging step and the post-heating imaging step acquires a captured image about each of a plurality of wavelengths; and
- the temperature distribution estimation step estimates the in-plane temperature distribution of the adjustment substrate in the thermal processing based on the captured image about the wavelength according to a film thickness of the resist film.

According to the (5), the in-plane temperature distribution in the thermal processing can be more accurately estimated, and the thermal processing result can be made more uniform within the substrate.

(6) The substrate processing apparatus according to any one of the (1) to (5), further including a developing processor configured to perform developing processing on the substrate, wherein
the adjustment processing includes:
- a developing processing step of controlling the developing processor to perform the developing processing on the adjustment substrate after the post-heating imaging step;
- a post-development imaging step of controlling the imager to image the adjustment substrate after the developing processing step;
- a film thickness distribution estimation step of estimating an in-plane distribution of the film thickness of the resist film after the developing processing on the adjustment substrate based on an imaging result at the thermal processing step; and
- a developing processing condition decision step of deciding processing conditions of the developing processing based on an estimation result of the in-plane distribution of the film thickness.

According to the (6), the developing processing can be performed so that its processing result becomes uniform within the substrate. Accordingly, a resist pattern with higher in-plane uniformity of the line width can be formed.

(7) The substrate processing apparatus according to any one of the (1) to (6), further including
a remover configured to perform removal processing of the resist film from the substrate wherein
the adjustment processing includes:
- a removal step of controlling the remover to remove the resist film formed on the adjustment substrate;
- a post-removal imaging step of controlling the imager to image the adjustment substrate after the removal step; and
- a determination step of determining whether to reuse the adjustment substrate based on an imaging result at the post-removal imaging step.

According to the (7), the consumption of the adjustment substrate can be suppressed without deteriorating the adjustment accuracy of the processing conditions.

(8) The substrate processing apparatus according to any one of the (1) to (7), wherein
the controller is configured to start the adjustment processing based on an estimation result of a line with of a resist pattern formed on the substrate in the actual processing.

(9) The substrate processing apparatus according to any one of the (1) to (8), wherein
the controller is configured to start adjustment processing of processing conditions of processing on an edge portion of the substrate based on an imaging result of the edge portion of the substrate in the actual processing.

(10) The substrate processing apparatus according to any one of the (1) to (9), wherein
the thermal processor includes:
a hot plate on which the substrate is to be mounted;
a lid configured to cover the substrate on the hot plate; and
a temperature regulation mechanism configured to regulate a temperature of the lid.

(11) A processing condition adjustment method of adjusting conditions of processing on a substrate, including:
- a pre-exposure imaging step of imaging an unexposed adjustment substrate on which a resist film is formed;
- a uniform exposure step of performing uniform exposure processing of exposing each region of a substrate surface with a fixed exposure amount on the adjustment substrate after the pre-exposure imaging step;

a thermal processing step of performing thermal processing on the adjustment substrate after the uniform exposure step;
a post-heating imaging step of imaging the adjustment substrate after the thermal processing step;
a temperature distribution estimation step of estimating an in-plane temperature distribution of the adjustment substrate in the thermal processing based on an imaging result at the pre-exposure imaging step and on an imaging result at the post-heating imaging step; and
a thermal processing condition decision step of deciding processing conditions in the thermal processing based on an estimation result of the in-plane temperature distribution of the adjustment substrate.

EXPLANATION OF CODES 1, 1a, 1b substrate processing apparatus
6 controller
40, 40a thermal processing unit
210 imager
F1 imaging result
F2 imaging result
W wafer

What is claimed is:

1. A substrate processing apparatus which processes a substrate, comprising:
a thermal processor configured to perform thermal processing on the substrate;
an imager configured to image the substrate; and
a controller, wherein:
the controller is configured to execute adjustment processing of adjusting conditions of processing on the substrate; and
the adjustment processing comprises:
a pre-exposure imaging step of controlling the imager to image an unexposed adjustment substrate on which a resist film is formed;
a thermal processing step of controlling the thermal processor to perform the thermal processing on the adjustment substrate subjected to uniform exposure processing of exposing each region of a substrate surface with a fixed exposure amount after the pre-exposure imaging step;
a post-heating imaging step of controlling the imager to image the adjustment substrate after the thermal processing step;
a temperature distribution estimation step of estimating an in-plane temperature distribution of the adjustment substrate in the thermal processing based on an imaging result at the pre-exposure imaging step and on an imaging result at the post-heating imaging step; and
a thermal processing condition decision step of deciding processing conditions of the thermal processing based on an estimation result of the in-plane temperature distribution of the adjustment substrate.

2. The substrate processing apparatus according to claim 1, further comprising:
an exposurer configured to perform the uniform exposure processing different from an external exposure apparatus configured to perform exposure processing in actual processing.

3. The substrate processing apparatus according to claim 1, wherein
the uniform exposure processing is performed by an external exposure apparatus configured to perform exposure processing in actual processing.

4. The substrate processing apparatus according to claim 1, wherein
the fixed exposure amount is less than an exposure amount in actual processing.

5. The substrate processing apparatus according to claim 1, wherein:
each of the pre-exposure imaging step and the post-heating imaging step acquires a captured image about each of a plurality of wavelengths; and
the temperature distribution estimation step estimates the in-plane temperature distribution of the adjustment substrate in the thermal processing based on the captured image about the wavelength according to a film thickness of the resist film.

6. The substrate processing apparatus according to claim 1, further comprising:
a developing processor configured to perform developing processing on the substrate, wherein
the adjustment processing comprises:
a developing processing step of controlling the developing processor to perform the developing processing on the adjustment substrate after the thermal processing step;
a post-development imaging step of controlling the imager to image the adjustment substrate after the developing processing step;
a film thickness distribution estimation step of estimating an in-plane distribution of the film thickness of the resist film after the developing processing on the adjustment substrate based on an imaging result at the post-development imaging step; and
a developing processing condition decision step of deciding processing conditions of the developing processing based on an estimation result of the in-plane distribution of the film thickness.

7. The substrate processing apparatus according to claim 1, further comprising:
a remover configured to perform removal processing of the resist film from the substrate wherein
the adjustment processing comprises:
a removal step of controlling the remover to remove the resist film formed on the adjustment substrate;
a post-removal imaging step of controlling the imager to image the adjustment substrate after the removal step; and
a determination step of determining whether to reuse the adjustment substrate based on an imaging result at the post-removal imaging step.

8. The substrate processing apparatus according to claim 1, wherein
the controller is configured to start the adjustment processing based on an estimation result of a line with of a resist pattern formed on the substrate in the actual processing.

9. The substrate processing apparatus according to claim 1, wherein
the controller is configured to start adjustment processing of processing conditions of processing on an edge portion of the substrate based on an imaging result of the edge portion of the substrate in the actual processing.

10. The substrate processing apparatus according to claim 1, wherein
the thermal processor comprises:
a hot plate on which the substrate is to be mounted;
a lid configured to cover the substrate on the hot plate; and
a temperature regulation mechanism configured to regulate a temperature of the lid.

11. A processing condition adjustment method of adjusting conditions of processing on a substrate, comprising:
- a pre-exposure imaging step of imaging an unexposed adjustment substrate on which a resist film is formed;
- a uniform exposure step of performing uniform exposure processing of exposing each region of a substrate surface with a fixed exposure amount on the adjustment substrate after the pre-exposure imaging step;
- a thermal processing step of performing thermal processing on the adjustment substrate after the uniform exposure step;
- a post-heating imaging step of imaging the adjustment substrate after the thermal processing step;
- a temperature distribution estimation step of estimating an in-plane temperature distribution of the adjustment substrate in the thermal processing based on an imaging result at the pre-exposure imaging step and on an imaging result at the post-heating imaging step; and
- a thermal processing condition decision step of deciding processing conditions in the thermal processing based on an estimation result of the in-plane temperature distribution of the adjustment substrate.

12. The processing condition adjustment method according to claim 11, wherein
the fixed exposure amount is less than an exposure amount in actual processing.

13. The processing condition adjustment method according to claim 11, wherein:
each of the pre-exposure imaging step and the post-heating imaging step acquires a captured image about each of a plurality of wavelengths; and
the temperature distribution estimation step estimates the in-plane temperature distribution of the adjustment substrate in the thermal processing based on the captured image about the wavelength according to a film thickness of the resist film.

14. The processing condition adjustment method according to claim 11, further comprising:
- a developing processing step of performing developing processing on the adjustment substrate after the thermal processing step;
- a post-development imaging step of imaging the adjustment substrate after the developing processing step;
- a film thickness distribution estimation step of estimating an in-plane distribution of the film thickness of the resist film after the developing processing on the adjustment substrate based on an imaging result at the post-development imaging step; and
- a developing processing condition decision step of deciding processing conditions of the developing processing based on an estimation result of the in-plane distribution of the film thickness.

15. The processing condition adjustment method according to claim 11, further comprising:
- a removal step of removing the resist film formed on the adjustment substrate;
- a post-removal imaging step of imaging the adjustment substrate after the removal step; and
- a determination step of determining whether to reuse the adjustment substrate based on an imaging result at the post-removal imaging step.

* * * * *